(12) United States Patent
Landes et al.

(10) Patent No.: US 7,784,738 B1
(45) Date of Patent: Aug. 31, 2010

(54) ELECTRONICS RACK COVER SYSTEMS

(76) Inventors: Mark J. Landes, 228 W. Bonita Ave., Claremont, CA (US) 91711; James M. Landes, 9404 Pond Rd. North, Bernidji, MN (US) 56601; Victor D. L'esperance, 228 W. Bonita Ave., Claremont, CA (US) 91711

( * ) Notice: Subject to any disclaimer, the term of this patent is extended or adjusted under 35 U.S.C. 154(b) by 1539 days.

(21) Appl. No.: 11/088,128

(22) Filed: Mar. 22, 2005

Related U.S. Application Data

(60) Provisional application No. 60/555,491, filed on Mar. 22, 2004.

(51) Int. Cl.
*B64C 1/14* (2006.01)
*H05K 5/03* (2006.01)

(52) U.S. Cl. .................. 244/129.4; 361/679.57

(58) Field of Classification Search .......... 244/224, 244/129.4; 361/268, 269, 679.57, 679.58, 361/726, 732, 747, 616; 180/90; 296/70, 296/72, 73
See application file for complete search history.

(56) References Cited

U.S. PATENT DOCUMENTS

| | | | | |
|---|---|---|---|---|
| 3,541,395 | A | * | 11/1970 | Lucchino .................. 361/693 |
| 4,888,968 | A | * | 12/1989 | Azvedo ..................... 70/163 |
| 4,991,057 | A | * | 2/1991 | Kriegisch et al. ......... 361/726 |
| 5,148,353 | A | * | 9/1992 | Morgan et al. ............ 361/726 |
| 5,208,735 | A | * | 5/1993 | Twachtmann et al. .... 361/725 |
| 5,735,147 | A | * | 4/1998 | Cattanach et al. ......... 70/164 |
| 7,032,862 | B2 | * | 4/2006 | Landes et al. ........... 244/129.1 |

* cited by examiner

*Primary Examiner*—Tien Dinh
(74) *Attorney, Agent, or Firm*—Stoneman Volk Patent Group; Martin L. Stoneman; Michael D. Volk, Jr.

(57) ABSTRACT

A security cover is disclosed for protecting installed avionics instruments and other electronic instruments. The cover includes multiple independent automatic locks that activate when the cover is abutted near the installed instruments. An automatic lock mechanism, adapted to electronic instrument covers, is also disclosed. The activated locks are not directly accessible to users and thieves. A lock release mechanism is disclosed for simultaneously unlocking each lock. A method of manufacturing using extruded aluminum panels is disclosed.

22 Claims, 13 Drawing Sheets

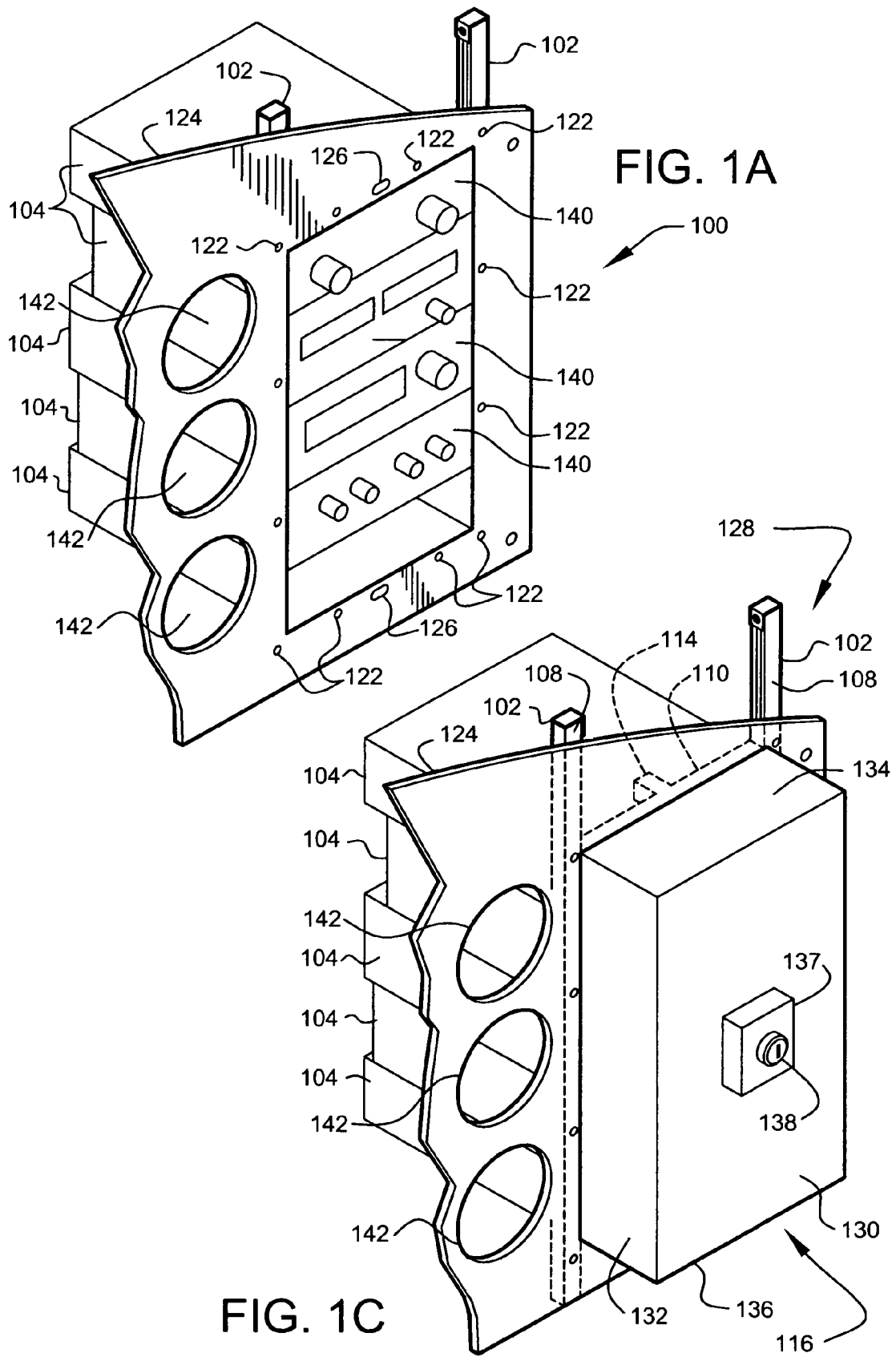

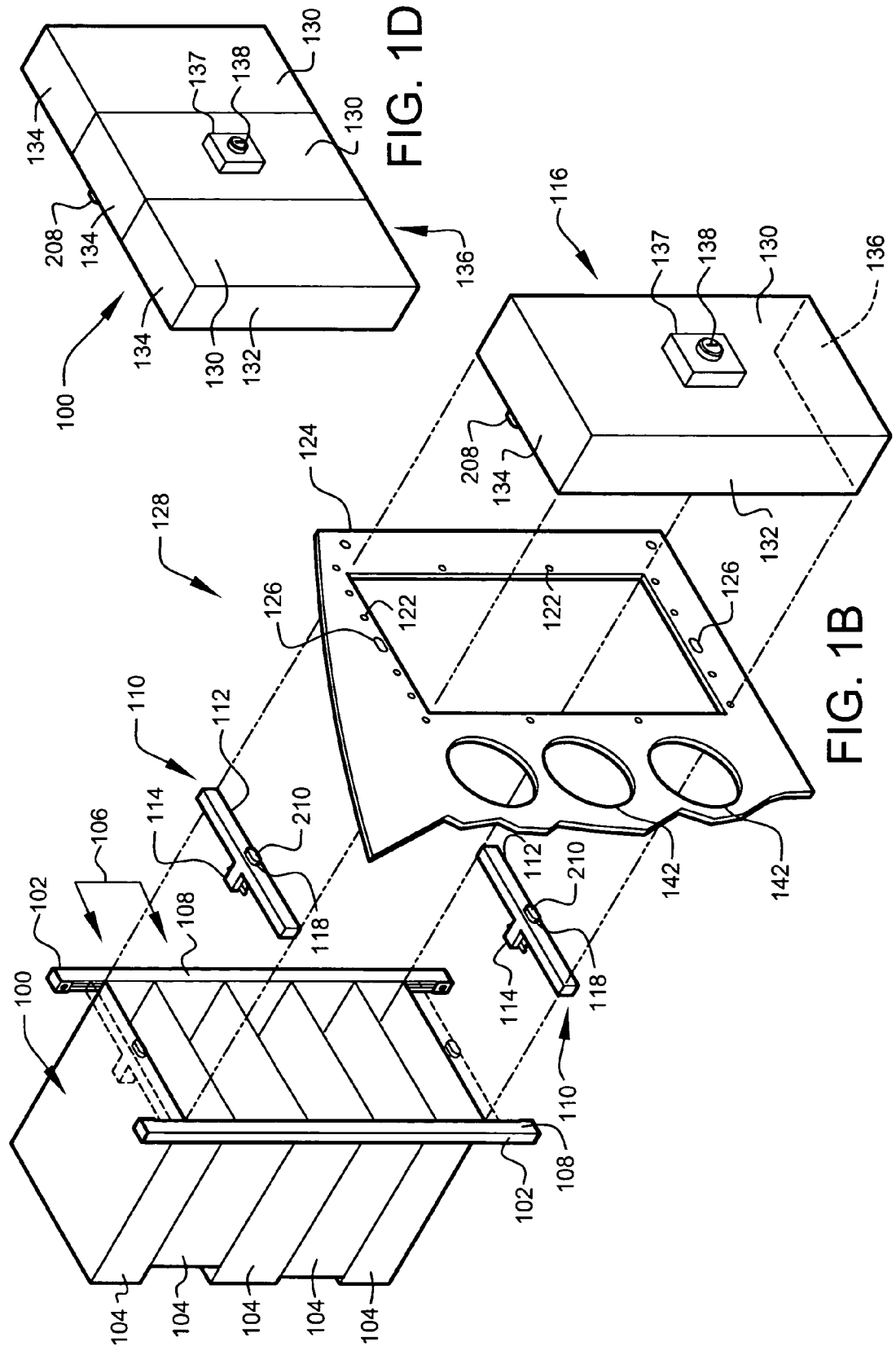

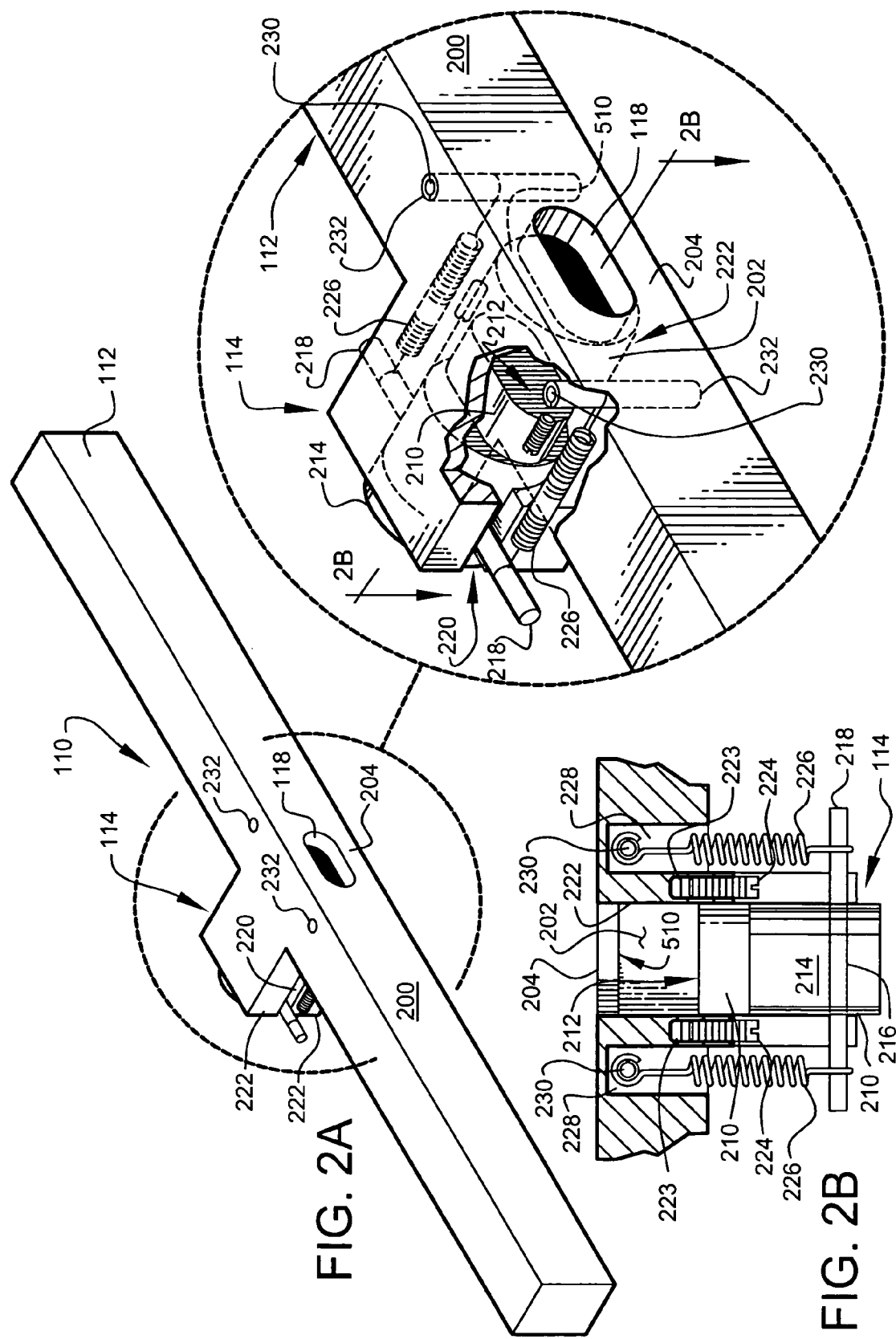

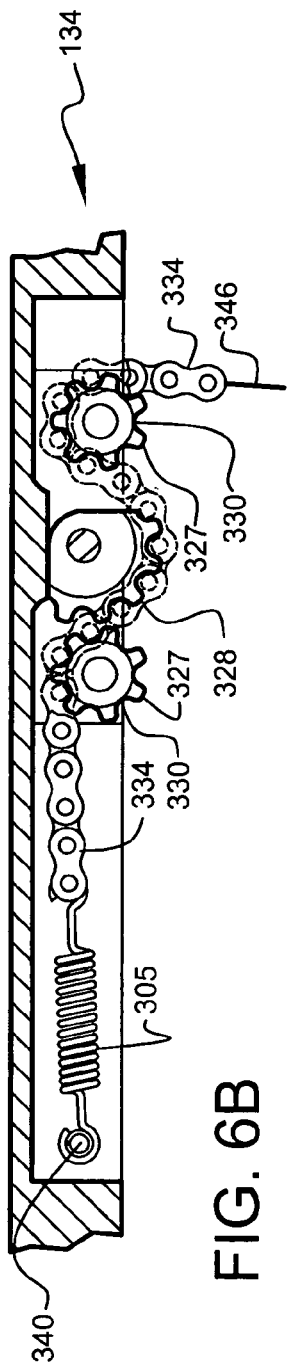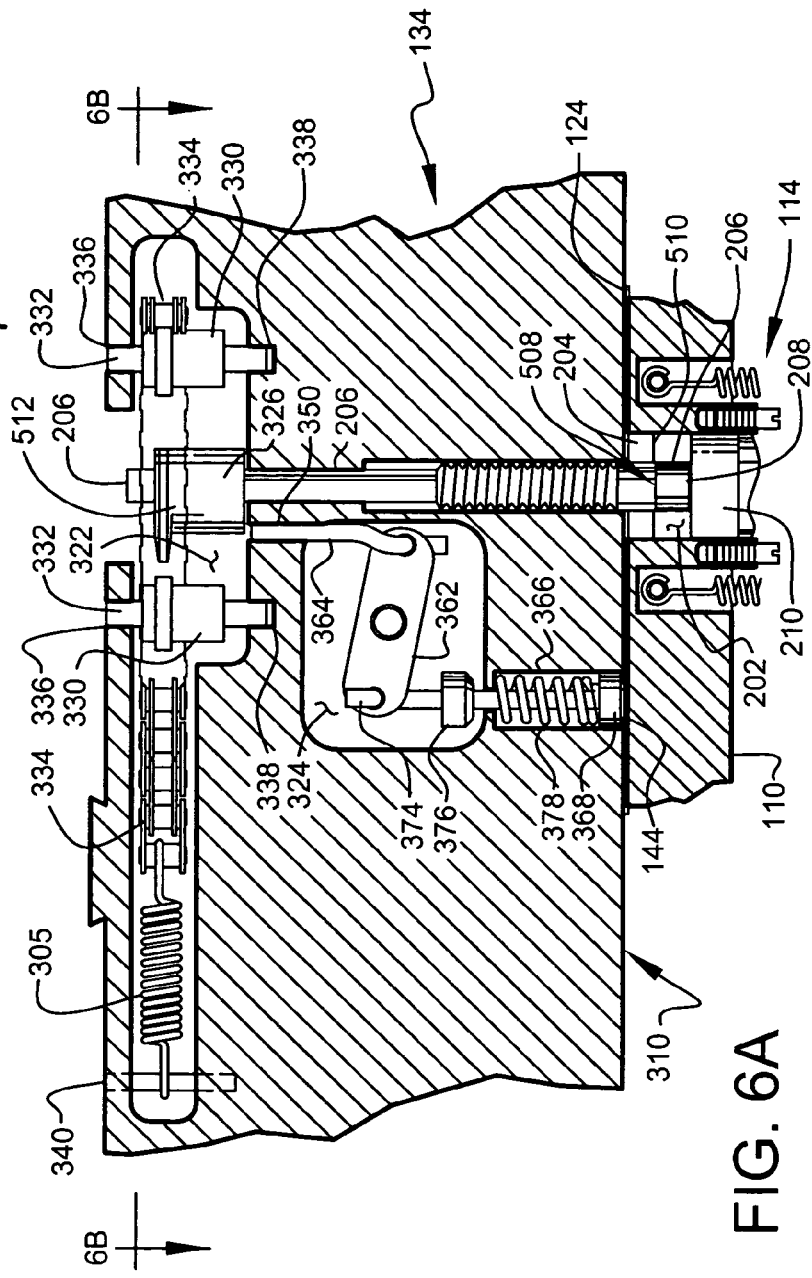

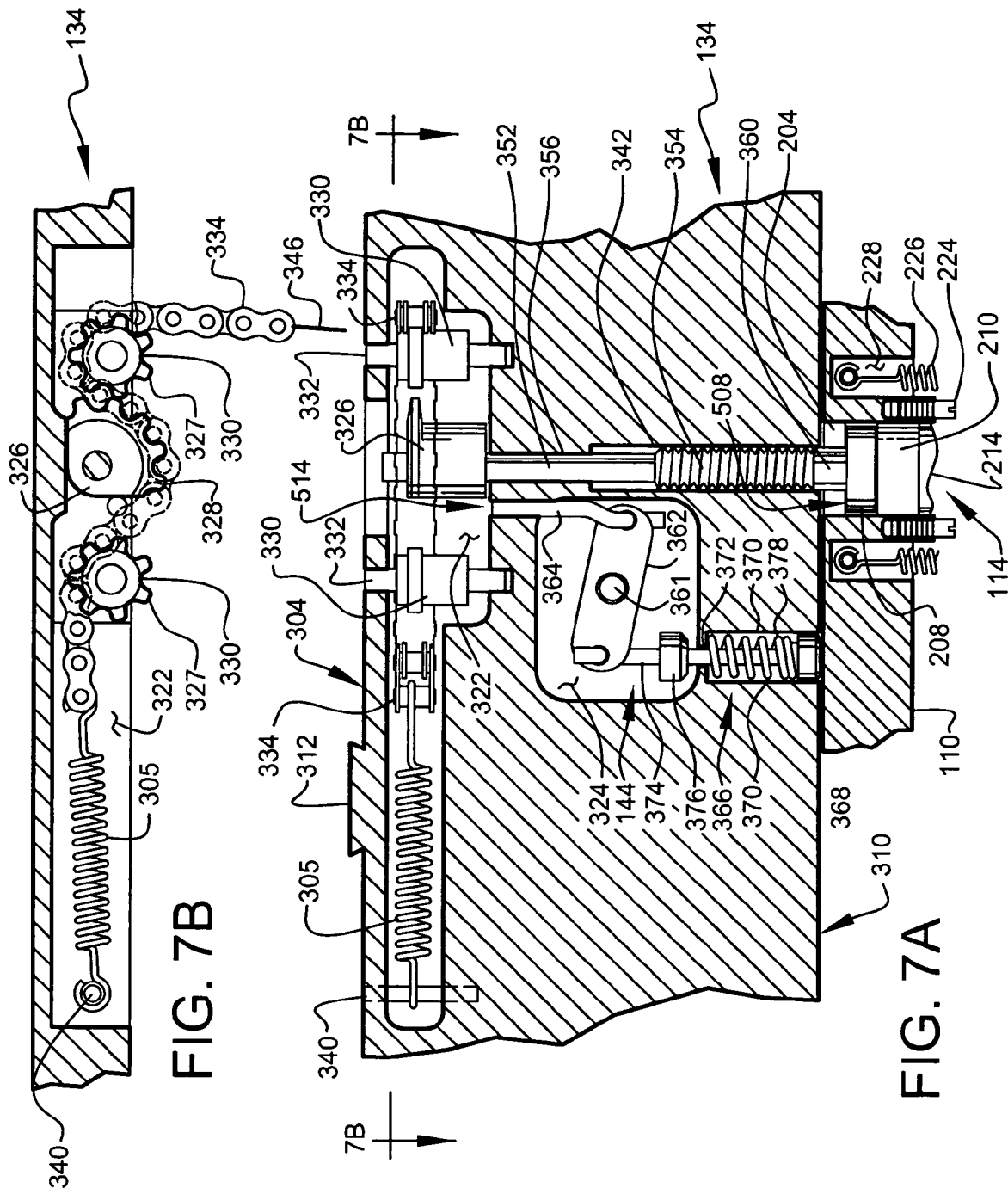

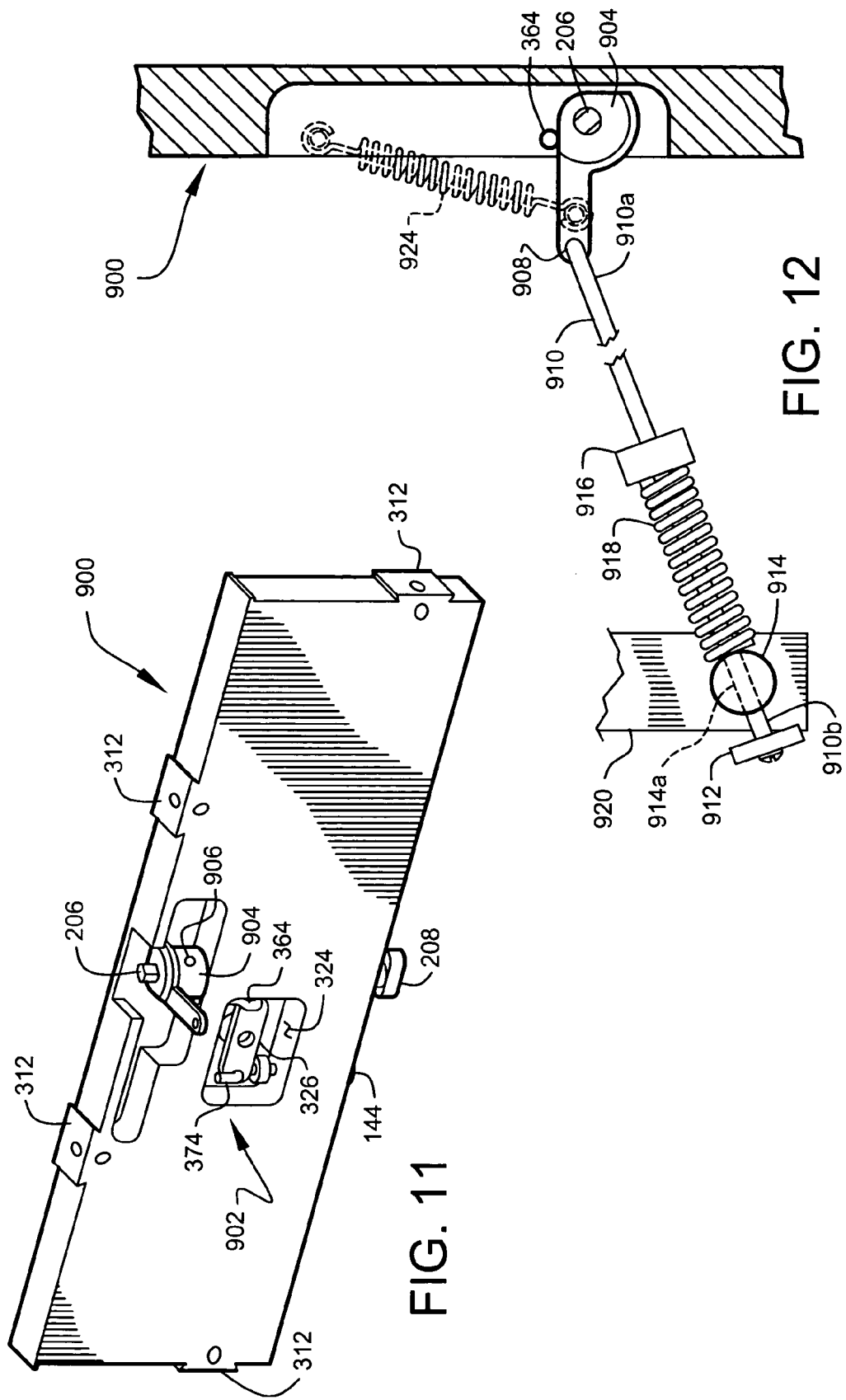

ELECTRONICS RACK COVER SYSTEMS

CROSS-REFERENCE TO RELATED APPLICATIONS

The present application is related to and claims priority from prior provisional application Ser. No. 60/555,491, filed Mar. 22, 2004, entitled "ELECTRONICS RACK COVER SYSTEMS", the contents of which are incorporated herein by this reference and are not admitted to be prior art with respect to the present invention by the mention in this cross-reference section.

In addition, the present application is related to applicant's prior utility patent application Ser. No. 10/391,039, filed Mar. 17, 2003, entitled "METHOD AND SYSTEM FOR MOUNTING RADIO AVIONICS" and applicant's prior U.S. Provisional Application Ser. No. 60/394,119, filed Jul. 3, 2002, entitled "METHOD AND SYSTEM FOR MOUNTING RADIO AVIONICS", and applicant's prior U.S. Provisional Application Ser. No. 60/365,482, filed Mar. 18, 2002, entitled "METHOD AND SYSTEM FOR MOUNTING RADIO AVIONICS, the contents of which are not admitted to be prior art with respect to the present invention by the mention in this cross-reference section.

BACKGROUND

This invention relates to electronics rack cover systems. More particularly, it relates to obstructing unauthorized access to at least one front face of at least one avionics instrument installed on at least one avionics rack in an aircraft.

Theft of electronic instruments, especially avionics from general aviation aircraft, continues to be a problem. Rack-mounted avionics, including radios, displays, and navigational instruments, are particularly popular with thieves because of their modularity and portability. Other rack-mounted electronics, such as upright personal computers, server stacks, telemetry instrumentation, and some component audio systems are also attractive to thieves. Avionics and other electronic instruments are typically inserted into the front of the rack and fastened in place. Accordingly, access to the front face of the instruments and the front face of the avionics rack must be physically obstructed to prevent theft. No avionics theft prevention system exists that effectively locates the attachment points, between such a physical obstruction means and the aircraft, out of easy reach of a thief. More specifically, no avionics theft prevention system exists that locates a locking mechanism, securing such means of physical obstruction, beyond easy reach of the thief. Furthermore, a means for preventing avionics theft, providing essentially complete avionics coverage, such as facial coverage in a single plane with front-side coverage, etc., does not exist.

Therefore, a need exists for a physically obstructive system that can be attached to inaccessible points in the aircraft or other electronics environment. In addition, a need exists for a physically obstructive system that can be locked at inaccessible points in the aircraft or other electronics environment. Furthermore, a need exists for a physically obstructive system that can provide complete coverage for rack-mounted electronic instruments.

OBJECTS AND FEATURES OF THE INVENTION

A primary object and feature of the present invention is to overcome the above-mentioned problems and fulfill the above-mentioned needs.

Another object and feature of the present invention is to provide an easy-to-use electronics-rack cover system that automatically locks in place when positioned to cover an electronics rack.

It is a further object and feature of the present invention to provide an electronics-rack cover system having at least two independent automatic locks.

It is a further object and feature of the present invention to provide an electronics-rack cover system with a single unlocking mechanism that cannot be used for locking.

It is a further object and feature of the present invention to provide an electronics-rack cover system having extruded aluminum front and side panels with integral dovetail grooves.

It is a further object and feature of the present invention to provide an electronics-rack cover system having end closures having dovetail extensions for attaching to the extruded aluminum panels.

It is a further object and feature of the present invention to provide an electronics-rack cover system having end closures with integral automatic locks.

It is a further object and feature of the present invention to provide an electronics-rack cover system having automatic locks with three stable states: armed, locked, and unlocked.

It is a further object and feature of the present invention to provide an electronics-rack cover system having a rack-mountable receiver for coupling with an end closure automatic locking mechanism.

It is a further object and feature of the present invention to provide an electronics-rack cover system having a receiver supporting such coupling behind the front face of the electronics rack.

It is a further object and feature of the present invention to provide an electronics-rack cover system having a rack-mountable receiver.

It is a further object and feature of the present invention to provide an electronics-rack cover system that is resistant to drilling.

It is a further object and feature of the present invention to provide an electronics-rack cover system having covers of various sizes.

It is a further object and feature of the present invention to provide an electronics-rack cover system having covers for arrays of electronics racks.

It is an additional primary object and feature of the present invention to provide such a system that is efficient, inexpensive and handy. Other objects and features of this invention will become apparent with reference to the following descriptions.

SUMMARY OF THE INVENTION

In accordance with a preferred embodiment hereof, this invention provides a cover system, relating to obstructing unauthorized access to a front portion of at least one instrument panel having at least one instrument installable proximate the at least one instrument panel, comprising: cover means for at least partially covering the front portion of the at least one instrument panel; and receiver means for receiving such cover means, wherein such receiver means comprises positioner means for positioning such receiver in relation to the at least one instrument panel to receive at least one portion of such cover means at a position substantially behind the at least one instrument panel. Moreover, it provides such a cover system, further comprising automatic lock means for locking such cover means to such receiver means responsive to such receiver means receiving such cover means. Additionally, it provides such a cover system, further comprising manual unlocking means for manually unlocking such automatic locking means, wherein such manual unlocking means is mechanically distinct from such automatic locking means. Also, it provides such a cover system, wherein such cover means comprises panel means for at least partially paneling over the front portion of the at least one instrument panel. In addition, it provides such a cover system, wherein such panel means comprises: extruded shape means for providing shape to such panel means; and open end means for providing open ends of such extruded shape means. And, it provides such a cover system, further comprising end closure means for closing such open end means of such extruded shape means. Further, it provides such a cover system, wherein such cover means further comprises partition means for partitioning such channel means. Even further, it provides such a cover system, wherein such end closure means comprises such automatic lock means. Moreover, it provides such a cover system, further comprising drill-resistant plate means for resisting drilling through such cover means abutted inside such cover means.

In accordance with another preferred embodiment hereof, this invention provides a cover system, relating to obstructing unauthorized access to at least one front face of at least one avionics rack operable to receive at least one avionics instrument installable proximate the at least one avionics rack, comprising: cover means for at least partially covering the at least one front face; and receiver means for receiving such cover means; wherein such receiver means comprises receptor means for reception of at least one portion of such cover means; and support means for supporting such receptor means substantially behind the at least one front face. Additionally, it provides such a cover system; further comprising automatic lock means for automatically locking such cover means to such receiver means responsive to such receiver means receiving such cover means. Also, it provides such a cover system, wherein such automatic lock means comprises: engager means for engaging such receptor means; engager bias means for biasing such engager means toward engagement with such receptor means; and initiator means for initiating engagement of such engager means with such receptor means responsive to such engager bias means after insertion of such engagement means within such receptor means. In addition, it provides such a cover system, wherein such initiator means comprises initiator bias means for biasing such initiator means away from initiating engagement with such receptor means. And, it provides such a cover system, wherein such automatic lock means further comprises: resistor means for resisting such engager bias means; and remover means for removing such resistor means from resisting such engager bias means responsive to such initiator means. Further, it provides such a cover system, wherein such remover means comprises rotor means for rotating responsive to such initiator means to remove such resistor means. Even further, it provides such a cover system, wherein such cover means comprises panel means for paneling over the at least one front face. Moreover, it provides such a cover system, wherein such panel means comprises extruded channel means for providing an extruded channel shape having open ends. Additionally, it provides such a cover system, wherein such cover means further comprises end closure means for closing such open ends of such panel means. Also, it provides such a cover system, wherein such end closure means comprises such automatic lock means. In addition, it provides such a cover system, wherein such panel means comprises unlocker means for unlocking such automatic locking means. And, it provides such a cover system, further comprising unlocker means for unlocking such cover means from such receiver means after engagement of such engager with such receptor. Further, it provides such a cover system, further comprising drill-resistant plate means for resisting drilling through such cover means abutted inside such cover means.

In accordance with another preferred embodiment hereof, this invention provides a cover system, relating to obstructing unauthorized access to at least one front face of at least one avionics rack operable to receive at least one avionics instrument installable proximate the at least one avionics rack, comprising: cover means for at least partially covering the at least one front face; and automatic lock means for automatically locking such cover means proximate the at least one avionics rack responsive to such cover means being placed in aligned abutment proximate the at least one avionics rack.

In accordance with another preferred embodiment hereof, this invention provides a cover system, relating to obstructing unauthorized access to at least one front face of at least one avionics rack operable to receive at least one avionics instrument installable proximate the at least one avionics rack, comprising: at least one cover adapted to cover the at least one front face; at least one receiver structured and arranged to receive such at least one cover; wherein such at least one receiver comprises: at least one receptor structured and arranged to be receptive to at least one portion of such at least one cover; and at least one support structured and arranged to support such at least one receptor substantially behind the at least one front face and proximate the at least one avionics rack. Even further, it provides such a cover system, further comprising at least one automatic lock structured and arranged to automatically lock such at least one cover to such at least one receiver responsive to such at least one receiver receiving such at least one cover. Moreover, it provides such a cover system, wherein such automatic lock comprises: at least one engager structured and arranged to engage such at least one receptor; at least one engager biasing mechanism adapted to bias such at least one engager toward engagement with such at least one receptor; and at least one initiator structured and arranged to initiate engagement of such at least one engager with such at least one receptor responsive to such at least one engager biasing mechanism after insertion of such at least one engager within such at least one receptor. Additionally, it provides such a cover system, wherein such at least one initiator comprises at least one initiator biasing mechanism adapted to bias such at least one initiator away from initiating engagement with such at least one receptor. Also, it provides such a cover system, wherein such automatic lock further comprises: at least one resistor adapted to resist such at least one engager biasing mechanism; and at least one remover structured and arranged to remove such at least one resistor from resisting such at least one engager biasing mechanism responsive to such at least one initiator. In addition, it provides such a cover system, wherein such at least one remover comprises at least one rotor adapted to rotate responsive to such at least one initiator to remove such at least one resistor. And, it provides such a cover system, wherein such at least one cover comprises at least one panel structured and arranged to panel over the at least one front face. Further, it provides such a cover system, wherein such at least one panel comprises: at least one extruded shape structured and arranged to provide an extruded shape for such at least one panel; and at least one open end adapted to provide at least one closable open end of such at least one panel. Even further, it provides such a cover system, wherein such at least one cover further comprises at least one end closure structured and arranged to close such at least one open end of such at least one panel. Moreover, it provides such a cover system, wherein such at least one end closure comprises such at least one automatic lock. Additionally, it provides such a cover system, wherein such at least one panel comprises at least one unlocker structured and arranged to unlock such at least one automatic lock. Also, it provides such a cover system, further comprising at least one unlocker structured and arranged to unlock such at least one cover after engagement of such at least one engager with such at least one receptor. In addition, it provides such a cover system, further comprising at least one drill-resistant plate abutted inside such at least one cover.

In accordance with another preferred embodiment hereof, this invention provides a cover system, relating to obstructing unauthorized access to at least one front face of at least one avionics rack operable to receive at least one avionics instrument installable proximate the at least one avionics rack, comprising: at least one cover structured and arranged to at least partially cover the at least one front face; and at least one automatic lock structured and arranged to automatically lock such at least one cover to the at least one avionics rack responsive to such at least one cover being placed in aligned abutment with the at least one avionics rack.

In accordance with another preferred embodiment hereof, this invention provides a cover system, relating to obstructing unauthorized access to at least one front face of at least one avionics instrument installed in at least one avionics rack in an aircraft, comprising: at least one substantially rigid cover having one open face; at least one automatic lock fixed to such at least one substantially rigid cover; wherein such at least one automatic lock is adapted to lock proximate to the at least one avionics rack; and is not directly accessible to a user when locked; and at least one lock release mechanism attached to such at least one substantially rigid cover, accessible to a user, and operable to release such at least one automatic lock.

In accordance with another preferred embodiment hereof, this invention provides a cover system relating to obstructing unauthorized access to at least one front face of at least one avionics instrument installable proximate at least one avionics instrument panel having at least one avionics rack, wherein such cover system includes an aluminum extrusion forming a front panel; two side panels each having dovetail grooves adapted to receive dovetail extensions of at least one end closure having an automatic locking mechanism, including lock hardware; and an unlocking mechanism, the cover system comprising the steps of: providing such aluminum extrusion; and cutting such aluminum extrusion to a length adapted to cover such avionics rack. And, it provides such a cover system, further comprising the steps of: providing such end closures; and attaching such end closures to such cut aluminum extrusion to cover such two open ends. Further, it provides such a cover system, further comprising the steps of: attaching at least one unlocker to such front panel; and linking such unlocker to such automatic locks. Even further, it provides such a cover system, wherein the step of providing such end closures further comprises the steps of: machining dovetails, complimentary to such dovetail grooves, on such end closure; machining at least one cavity into such end closure on an operationally inward side of such end closure; drilling a plurality of bores into such end closure; and installing lock hardware in such at least one cavity and such plurality of bores. Even further, it provides such a cover system, wherein the step of installing lock hardware comprises the steps of: forming at least one engager; installing such at least one engager in at least one bore of such plurality of bores; installing at least one quarter sprocket on such at least one engager; installing at least two idler sprockets proximate such at least one quarter sprocket; installing at least one roller chain engaging such at least two idler sprockets and at least one quarter sprocket; installing at least one spring biasing such at least one quarter sprocket toward a locking orientation; installing at least one resisting pin positionable to resist rotation of such at least one quarter sprocket; installing at least one initiating pin positionable to initiate removal of such at least one resisting pin from resisting rotation of such at least one quarter sprocket; and installing at least one rotor linking such at least one initiating pin to such at least one resisting pin. Even further, it provides such a cover system, further comprising the steps of: cutting at least one receiver from bar stock; forming at least one receptor cavity in such at least one receiver; forming at least one front-facing opening in such at least one receptor cavity; forming at least one receptor cavity plug; installing such at least one receptor cavity plug in such at least one receptor cavity.

In accordance with another preferred embodiment hereof, this invention provides a cover system, relating to obstructing unauthorized access to a front portion of at least one instrument panel having at least one instrument installable proximate the at least one instrument panel, comprising: at least one cover structured and arranged to at least partially cover the front portion of the at least one instrument panel; and at least one receiver structured and arranged to receive such at least one cover, wherein such at least one receiver comprises at least one positioner structured and arranged to position such at least one receiver in relation to the at least one instrument panel to receive at least one portion of such at least one cover at a position substantially behind the at least one instrument panel. Even further, it provides such a cover system, further comprising at least one automatic lock structured and arranged to lock such at least one cover to such at least one receiver responsive to such at least one receiver receiving such at least one cover. Even further, it provides such a cover system, further comprising at least one manual unlocker structured and arranged to manually unlock such at least one automatic lock, wherein such at least one manual unlocker is mechanically distinct from such at least one automatic lock. Even further, it provides such a cover system, wherein such at least one cover comprises at least one panel adapted to at least partially panel over the front portion of the at least one instrument panel. Even further, it provides such a cover system, wherein such at least one panel comprises: at least one extruded shape adapted to provide shape to such at least one panel; and at least one open end adapted to provide at least one open end of such at least one extruded shape. Even further, it provides such a cover system, further comprising at least one end closure structured and arranged to close such at least one open end of such at least one extruded shape. Even further, it provides such a cover system, wherein such at least one cover further comprises at least one partition structured and arranged to partition such at least one channel. Even further, it provides such a cover system, wherein such at least one end closure comprises such at least one automatic lock. Even further, it provides such a cover system, further comprising at least one drill-resistant plate, structured and arranged to resist drilling through such at least one cover, abutted inside such at least one cover.

BRIEF DESCRIPTION OF THE DRAWINGS

FIG. 1A is a perspective view illustrating a portion of an avionics rack inside a cockpit with instrument panel openings of the electronics rack cover system according to a preferred embodiment of the present invention.

FIG. 1B is an exploded perspective view illustrating an electronics rack cover system according to a preferred embodiment of the present invention.

FIG. 1C is a perspective view further illustrating the electronics rack cover system installed according to the preferred embodiment of FIG. 1B.

FIG. 1D is a perspective view illustrating an alternate preferred embodiment of the present invention adapted to arrays of racks.

FIG. 2A is a perspective view illustrating the receiver of the electronics rack cover system according to a preferred embodiment of the present invention.

FIG. 2B is a cross-sectional view through section 2B-2B of FIG. 2A illustrating a receptor according to the preferred embodiment of FIG. 2A.

FIG. 6A is a sectional view through the planar section A-A of FIG. 3 illustrating details of an end closure locked to the receiver of the electronics rack cover system according to a preferred embodiment of the present invention.

FIG. 6B is a top plan sectional view through section 6B-6B of FIG. 6A illustrating details of an end closure locked to the receiver of the electronics rack cover system.

FIG. 7A is a sectional view through the planar section A-A of FIG. 3 illustrating details of an end closure unlocked just prior to removal from the receiver of the electronics rack cover system.

FIG. 7B is a sectional view through section 7B-7B of FIG. 7A illustrating details of an end closure unlocked just prior to removal from the receiver of the electronics rack cover system.

FIG. 11 is a perspective view illustrating an alternate end closure of the electronics rack cover system according to another preferred embodiment of the present invention.

FIG. 12 is a top view partially in section illustrating the actuating mechanism of the alternate end closure of FIG. 11.

Figure 3:
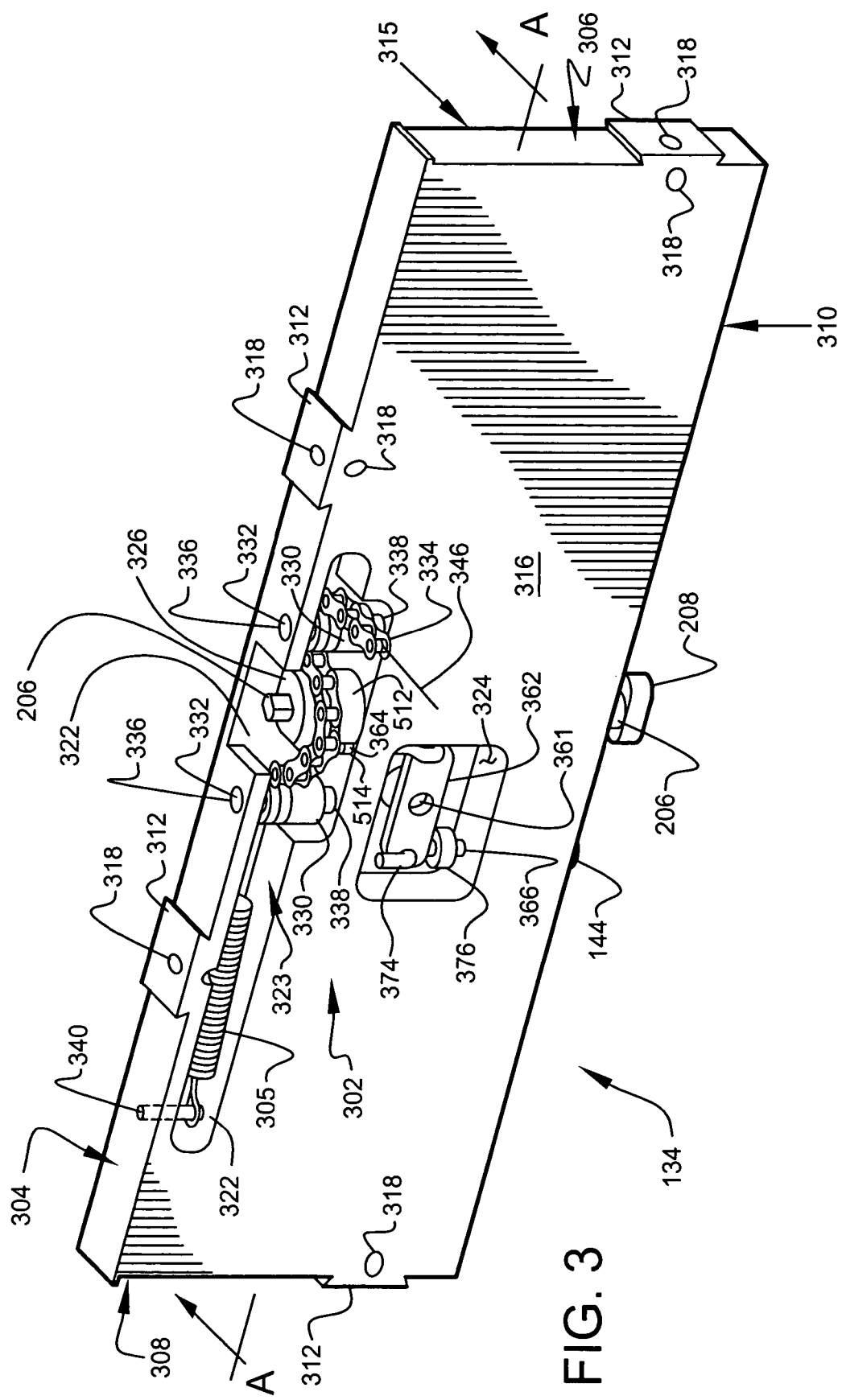
FIG. 3 is a perspective view illustrating an end closure of the electronics rack cover system according to the preferred embodiment of FIG. 1B.

DETAILED DESCRIPTION OF THE BEST MODES AND PREFERRED EMBODIMENTS OF THE INVENTION

As defined and used herein, "rack" refers to various structures including at least two generally-parallel spaced-apart rigid members adapted to receive mounting hardware for mounting electronic instruments, components, and the like and optionally covered in part by instrument paneling or instrument flanges. For example, and without limitation, "rack" includes avionics racks such as those disclosed in the related patent applications mentioned above, the interior structure of a personal computer used for mounting disc drives and the like, instrument racks used for holding telemetry processing instruments at telemetry gathering and processing sites, and racks for mounting computer server stacks.

As defined and used herein an "unlocker" refers to a lock release mechanism which is incapable of locking a particular lock but which can unlock that particular lock.

As defined and used herein, "box" refers to, without limitation, a rack-mountable electronic module, tray, instrument, case, video display, radio, or the like, intended to be mounted on a rack.

FIG. 1A is a perspective view illustrating a portion of an avionics rack 100 inside a cockpit with instrument panel openings 126 of the electronics rack cover system 128 according to a preferred embodiment of the present invention. Preferably, the cockpit comprises an instrument panel 124. Preferably, the instrument panel 124 has at least one instrument panel opening 126, as shown, sized, shaped, and located to receive an engager head 208, of the electronics rack cover system 128, as will be described in more detail below. The instrument panel 124 preferably has fastener openings 122 to assist in securing boxes 104 and/or other structures to the instrument panel 124. Avionics boxes 104, which may include avionics instruments 140, extend rearward of the avionics rack 100. Protrusions, such as knobs and switches, protrude from avionics instruments 140 in front of the avionics rack 100. Typically, the instrument panel 124 also includes openings 142 for avionic instruments that are not rack-mounted. Upon reading the teachings of this specification, those with ordinary skill in the art will now understand that, under appropriate circumstances, considering such issues as rack design, environmental factors (such as aircraft design), materials, accessibility behind the instrument panel, convenience, economics, user preference, etc., other approaches to covering, such as covering avionics which are not rack-mounted, providing instrument panel openings independent of rack-mounted avionics, covering both rack-mounted and panel-mounted avionics, using other pre-existing aircraft structure in place of the instrument panel, etc., may suffice.

FIG. 1B is an exploded perspective view illustrating the electronics rack cover system 128 according to a preferred embodiment of the present invention. Preferably, the electronics rack cover system 128 comprises a cover 116 and at least one receiver 110, as shown. The avionics rack 100 preferably includes two spaced-apart, generally parallel, obliquely inclined rails 102 situated behind the instrument panel 124 on either side of the avionics boxes 104. Avionics boxes 104 of various types are secured to the rails 102 for support. Preferably, the rails 102 approximately define an approximate geometric plane 106. The instrument panel 124 is attached to the rails 102 by fasteners through fastener openings 122. The rails 102 are preferably those manufactured by RadioRax of Claremont, Calif. Upon reading the teachings of this specification, those with ordinary skill in the art will now understand that, under appropriate circumstances, considering issues such as, avionics configuration, type of aircraft, etc., other receiver support arrangements, such as, for example, adapting a receiver to be supported within other structures of the aircraft, mounting directly to the rear of the rear of the instrument panel, etc., may suffice.

The rails 102 approximately define geometric plane 106 that is disposed at a desired viewing angle to a user or operator of the instruments/avionics contained within boxes 104 mounted on the rack 100. The portion of the rack 100 facing the pilot or other user is referred to herein as the "front" of the rack 100, and the plane 106 defined by the front surfaces of the rails 102 is referred to herein as the "front face 108" of the avionics rack 100. The rails 102 preferably provide substantial variability in vertically positioning boxes 104. Preferably, each receiver 110 is mounted behind the instrument panel 124, as indicated by the instrument panel openings 126 that are aligned to the front facing openings 118 of the receivers 110.

Preferably, two receivers 110 are attached, or anchored, transversely to the rails 102 to provide receptors 114 behind the front face 108, as shown. Preferably, each receiver 110 has a support 112 and a receptor 114 having a front-facing opening 118, as shown, for receiving an engaging mechanism, or engager head 208, that couples the cover 116 (at least herein embodying cover means for at least partially covering the front face of the at least one avionics instrument) to the receiver 110 (at least herein embodying receiver means for receiving said cover means). The receivers 110 are preferably attached to the instrument panel 124 preferably using conventional screws through fastener openings 122. In an alternate preferred embodiment, the receivers 110 are mounted on the rails 102 using attachment mechanisms adapted for positioning rack-installable objects at any point on the rails 102, such as those disclosed in applicant's above-mentioned utility patent application entitled "METHOD AND SYSTEM FOR MOUNTING RADIO AVIONICS". Upon reading the teachings of this specification, those with ordinary skill in the art will now understand that, under appropriate circumstances, considering such issues as rack design, environmental factors (such as aircraft design), materials, accessibility behind the front face, convenience, economics, user preference, etc., other approaches to positioning the receptors behind the front face, such as anchoring the receiver elsewhere (perhaps on an aircraft structural element), providing racks with integral receivers, or using other attachment mechanisms, etc., may suffice.

Preferably, the upper receiver 110 is positioned to align the front-facing opening 118 of the receptor 114 to the instrument panel opening 126, as shown. The receptor 114 (at least herein embodying receptor means for reception of at least one portion of said cover means) of the upper receiver 110 preferably receives the engager head 208 through the instrument panel opening 126. Preferably, a lower receiver 110 is mounted with its front surface flush with the front face 108 of the rack 100. Preferably, the front-facing opening 118 of the receptor 114 is positioned and supported to receive the engager 206. Preferably, the lower receiver 110 is mounted behind and abutting a lower portion of the instrument panel 124 having a similar instrument panel opening 126. Upon reading the teachings of this specification, those with ordinary skill in the art will now understand that, under appropriate circumstances, considering such issues as rack design, environmental factors (such as aircraft design), materials, accessibility behind the front face, convenience, economics, user preference, etc., other approaches for coupling the engager heads to the receivers, such as omitting the instrument panel, having the cover edges abutting the instrument panel not all in a geometric plane (adaptive to uneven racks), having more or fewer engager/receiver pairs, or having the engager heads extend from interior edges of partitions within the cover, etc., may suffice.

Preferably, the cover 116 has a front cover panel 130, two side cover panels 132 (at least herein embodying panel means for paneling over the front face of the at least one avionics instrument), an upper end closure 134, and a lower end closure 136, as shown. The cover 116 preferably has one engager head 208 for each instrument panel opening 126. Preferably, the unlocker 138 is centrally located on the front panel of the cover 116 (at least herein embodying wherein said panel means comprises unlocker means for unlocking said automatic locking means; and unlocker means for unlocking said cover means from said receiver means after engagement of said engager with said receptor). The cover 116 is preferably positioned with the engager heads 208 aligned to the instrument panel openings 126 and abutted to the instrument panel 124, thereby inserting the engager heads 208 (at least herein embodying engager means for engaging said receptor means) through the instrument panel openings 126 and into the receptors 114. Preferably, independent automatic locks 302, as shown in FIG. 3, (at least herein embodying automatic lock means for automatically locking said cover means to said receiver means responsive to said receiver means receiving said cover means) associated with each engager head 208 rotate each engager head 208 into a locked position in response to the cover 116 being abutted to the instrument panel 124. The unlocker 138 (at least herein embodying unlocker means for unlocking said cover means from said receiver means after engagement of said engager with said receptor) is preferably operable by the user to simultaneously unlock all automatic locks 302 with a key. Preferably, the unlocker 138 cannot be used to lock the automatic locks 302. Preferably, the unlocker 138 is mono-stable. Upon reading the teachings of this specification, those with ordinary skill in the art will now understand that, under appropriate circumstances, considering such issues as rack design, environmental factors (such as aircraft design), materials, accessibility behind the front face, convenience, economics, user preference, etc., other approaches to automatically locking the cover in place, such as contact-activated latches, active rather than passive receivers, or various other unlocker apparatus, etc., may suffice.

FIG. 1C is the perspective view further illustrating the electronics rack cover system 128 installed according to the preferred embodiment of FIG. 1B. Preferably, the cover 116 provides coverage of mounted boxes 104 and portions of the instrument panel 124, instrument flanges, and the like from the front, sides, and top and bottom ends, as shown. Preferably, automatic locking of the cover 116 to the receivers 110 takes place behind the front face 108 at the surface where the engager head 208 contacts an interior surface of the receptor 114 (see also FIG. 1B). Preferably, the front cover panel 130 has a key-operated unlocker 138 to release the independent automatic locks 302 to permit removal of the cover 116 after installation, as shown. Upon reading the teachings of this specification, those with ordinary skill in the art will now understand that, under appropriate circumstances, considering such issues as rack design, environmental factors (such as aircraft design), materials, accessibility behind the front face, convenience, economics, user preference, etc., other orientations of the cover, such as a sideways orientation, various diagonal orientations, etc., may suffice.

The side-cover panels 132 are preferably sized to provide stand-off clearance between the underside of the cover 116 and the fronts of the covered avionics instruments 140, which may include switches, knobs, or other protrusions. The dimensions of the cover 116 are preferably adapted to particular makes and models of racks 100, as shown. Preferably, the cover 116 tightly abuts the instrument panel 124. Avionics instruments 140 typically comprise flanges that extend over adjacent portions of the front face 108 of the rails 102. The flanges are typically the same thickness as the upper and lower instrument panels 124. Accordingly, the installed cover 116 is adaptable to abut a flat surface comprised of instrument panels 124 and/or instrument flanges. Upon reading the teachings of this specification, those with ordinary skill in the art will now understand that, under appropriate circumstances, considering such issues as rack design, environmental factors (such as aircraft design), materials, accessibility behind the front face, convenience, economics, user preference, etc., other approaches to abutting the cover proximate the rack, such as receiving grooves in the instrument panel, rails, and/or receivers for receiving at least a portion of the edges of the cover, etc., may suffice.

FIG. 1D is the perspective view of FIG. 1B illustrating an alternate electronics rack cover system 128 according to an alternative preferred embodiment of the present invention. Racks 100 are sometimes used to form an array of racks 100 for large installations of avionics boxes 104. A plurality of covers 116 are preferably attached abutted side-by-side, as shown, to cover respective side-by-side racks 100 in the array of racks 100. The attachment is preferably with setscrews through threaded bores formed in the sides of each abutted cover 116. Preferably, only one rack 100 of the plurality of racks 100 has receivers 110 and only the cover 116 on that rack 100 has an unlocker 138, as shown. Upon reading the teachings of this specification, those with ordinary skill in the art will now understand that, under appropriate circumstances, considering such issues as rack design, environmental factors (such as aircraft design), materials, accessibility behind the front face, convenience, economics, user preference, etc., other combinations of connected covers, such as connected covers of different dimensions and/or orientations, more or fewer connected covers, or various numbers of unlocks, etc., may suffice.

FIG. 2A is a perspective view illustrating a receiver 110 of the electronics rack cover system 128 according to a preferred embodiment of the present invention. FIG. 2B is a cross-sectional view through section 2B-2B of FIG. 2A illustrating a receptor 114. In the following discussion, reference is made to both FIG. 2A and FIG. 2B, with continued reference to the prior figures. Preferably, the receiver 110 comprises a receptor 114 and a support 112 (at least herein embodying support means for supporting said receptor means substantially behind the front face). Preferably, the support 112 attaches in a transverse relationship to the rack 100 (see FIG. 1A) to position and support 112 the receptor 114 in alignment with the lower and upper panel opening 126, as shown in FIG. 1B.

In alternate preferred installations, the lower receiver 110 of FIG. 1B is installed on the rails 102 without the overlay of instrument panel 124 (and in such an installation an initiator pin 144, described below in relation to FIG. 3, of the cover 116 is pressed against front-facing surface 200 thus initiating automatic locking of the cover 116). Most preferably, the support 112 of the upper receiver 110 is installed behind the instrument panel 124 and the instrument panel 124 provides a surface for depressing the initiator pin 144. Preferably, receiver 112 comprises transverse bores 232 for receiving plug spring anchor pins 230, as shown. Upon reading the teachings of this specification, those with ordinary skill in the art will now understand that, under appropriate circumstances, considering such issues as rack design, environmental factors (such as aircraft design), materials, accessibility behind the front face, convenience, economics, user preference, etc., other receiver designs, such as receivers having supports for attaching to nearby structure other than the rack, other materials (boron-epoxy composites, drill-resistant materials, etc), or shapes adapted to particular racks in particular cockpits, etc., may suffice.

Preferably, the receptor 114 includes a receptor cavity 202 having a front wall 204 having a front-facing opening 118 that has a greater length than width, as shown. The receptor cavity 202 preferably has a least transverse dimension greater than the length of the front-facing opening 118, as shown. Preferably, the front-facing opening 118 receives the rotatable engager 206, described in more detail below in relation to FIG. 3, which has an engager head 208 shaped to be received by the front-facing opening 118 in one orientation. The rotatable engager 206 is preferably first received into the receptor cavity 202, and then rotated to engage the inner surface 510 of the front wall 204 and thereby lock the cover 116 to the receiver 110.

The front-facing opening 118 is preferably plugged, when not receiving the engager 206, with a spring-biased closure plug 210 that is adapted to slide within the receptor cavity 202. The closure plug 210 is shown in FIG. 2B in the depressed position consistent with the engager head 208 (omitted for ease of illustration) being inside the receptor cavity 202. The closure plug 210 preferably has a substantially flat upper surface 212, an elongated body 214, and a holder 216, as shown in FIG. 2B, for holding a spring-biased rod 218 that slides in opposed slots 220 in the rearward end of the receptor cavity sidewalls 222, as shown. The closure plug 210 is useful in installations where the avionics panel functions as an air barrier. For example, where the rear side of the avionics panel is cooled to protect the avionics and the front side temperature is maintained for the comfort of human beings, the closure plug 210 reduces air exchange between front and rear spaces. Upon reading the teachings of this specification, those with ordinary skill in the art will now understand that, under appropriate circumstances, considering such issues as receiver design, environmental factors, materials, accessibility behind the front face, convenience, economics, user preference, etc., other approaches to plugging the instrument panel opening, such as a manual exterior closure plug, sliding cover, or various other closures, etc., may suffice.

The closure plug 210 is preferably biased to a position, when no cover 116 is installed, that brings the substantially flat upper surface 212 of the closure plug 210 flush with the front surface of the instrument panel 124. The biased position is preferably adjustable by means of adjustment setscrews 224 adjustably extending into the slots 220, as shown. Preferably, the holder 216 at the operationally rearward end of the closure plug 210 holds the spring-biased rod 218 that, in turn, engages closure plug springs 226 anchored in the receiver 110 support 112, as shown. The closure plug springs 226 are preferably anchored in spring cavities 228 by transverse anchor pins 230 that are installed through bores 232 transverse to the spring cavities 228, as shown. Preferably, the length of the closure plug 210 is selected in relationship to the length of the receptor cavity 202 such that, when the cover 116 is in the locked position, the closure plug 210 still provides a substantial barrier to air flow through the front-facing opening 118 of the receptor 114, as shown, and the instrument panel opening 126. Upon reading the teachings of this specification, those with ordinary skill in the art will now understand that, under appropriate circumstances, considering such issues as rack design, environmental factors (such as aircraft design), materials, accessibility behind the front face, convenience, economics, user preference, etc., other approaches to biasing the closure plug toward closure, such as various other springs, use of air pressure differentials, or solenoids, etc., may suffice.

FIG. 3 is a perspective view illustrating an end closure 134 (similar to end closure 136) of the electronics rack cover system 128 according to the preferred embodiment of FIG. 1B. Preferably, the end closure 134 comprises a generally rectangular flat panel machined to support an automatic lock 302 (at least herein embodying wherein said end closure means comprises said automatic lock means) and to connect to cover panels 130 and 132 to assist in forming a cover 116, as shown in FIG. 4A. Preferably, the end closure 134 has a thickness of approximately 0.385 inches and at least four perimeter surfaces 304, 306, 308, and 310, as shown. Three perimeter surfaces 304, 306, and 308, of the end closure 134 preferably comprise dovetails 312 adapted to be received in complimentary dovetail grooves 314, as shown in FIG. 4A, in front and side cover panels 130 and 132 to form a cover 116 when both ends of the front cover panel 130 have end closures 134 and 136, as shown in FIG. 4A. Preferably, a first, longer, perimeter surface 304 is adapted to engage the underside of the front cover panel 130, as shown. The second and third perimeter surfaces 306 and 308 are preferably adapted to engage the side cover panels 132, as shown. The fourth, operationally rearward, perimeter surface 310 is preferably shaped to be abutted to the instrument panel 124 overlaying the receiver 110. Preferably, the end closure 134 comprises a machined inner face 316 for supporting the automatic lock 302, and a flat outer face 315 (opposite inner face 316). Automatic lock 302 preferably comprises the engager head 208, the cavities 322 and 324, and the mechanisms housed therein. Preferably, the end closure 134 further comprises oblique threaded bores 318 through the inner face 316 that are adapted to assist in securing the end closure 134 to the cover panels 130 and 132 with setscrews 320. Upon reading the teachings of this specification, those with ordinary skill in the art will now understand that, under appropriate circumstances, considering such issues as materials availability, materials compatibility, machining costs, convenience, economics, user preference, etc., other approaches to integrating end closures with extruded cover panels, such as various joints, fasteners, or welding, etc., may suffice.

Preferably, the end closure 134 includes an actuator cavity 322 proximate the first perimeter surface 304 and a rotor cavity 324 disposed between the actuator cavity 322 and the fourth perimeter surface 310, as shown. The actuator cavity 322 preferably opens to the first perimeter surface 304 for convenience in installing a quarter sprocket 326 housed therein, as shown. Preferably, two idler sprockets 330, supported by axle pins 332, are located on either side of the quarter sprocket 326, as shown. Each axle pin is preferably installed through smooth bores 336 through the first perimeter surface 304, as shown. The teeth 327 of the idler sprockets 330 are preferably in a plane with the teeth 328 of the quarter sprocket, (see also FIG. 5A). Preferably, aligned smooth bores 338, into an actuator cavity surface 323, distal to the fourth perimeter surface 304, receive the axle pins 332, as shown. Upon reading the teachings of this specification, those with ordinary skill in the art will now understand that, under appropriate circumstances, considering such issues as simplicity, environmental factors, materials, maintenance costs, reliability, convenience, economics, user preference, etc., other linkages to the engager, such as bar linkages, rack and pinion assemblies, a drum with a cable winding, etc., may suffice.

Figures 5A, 5B:
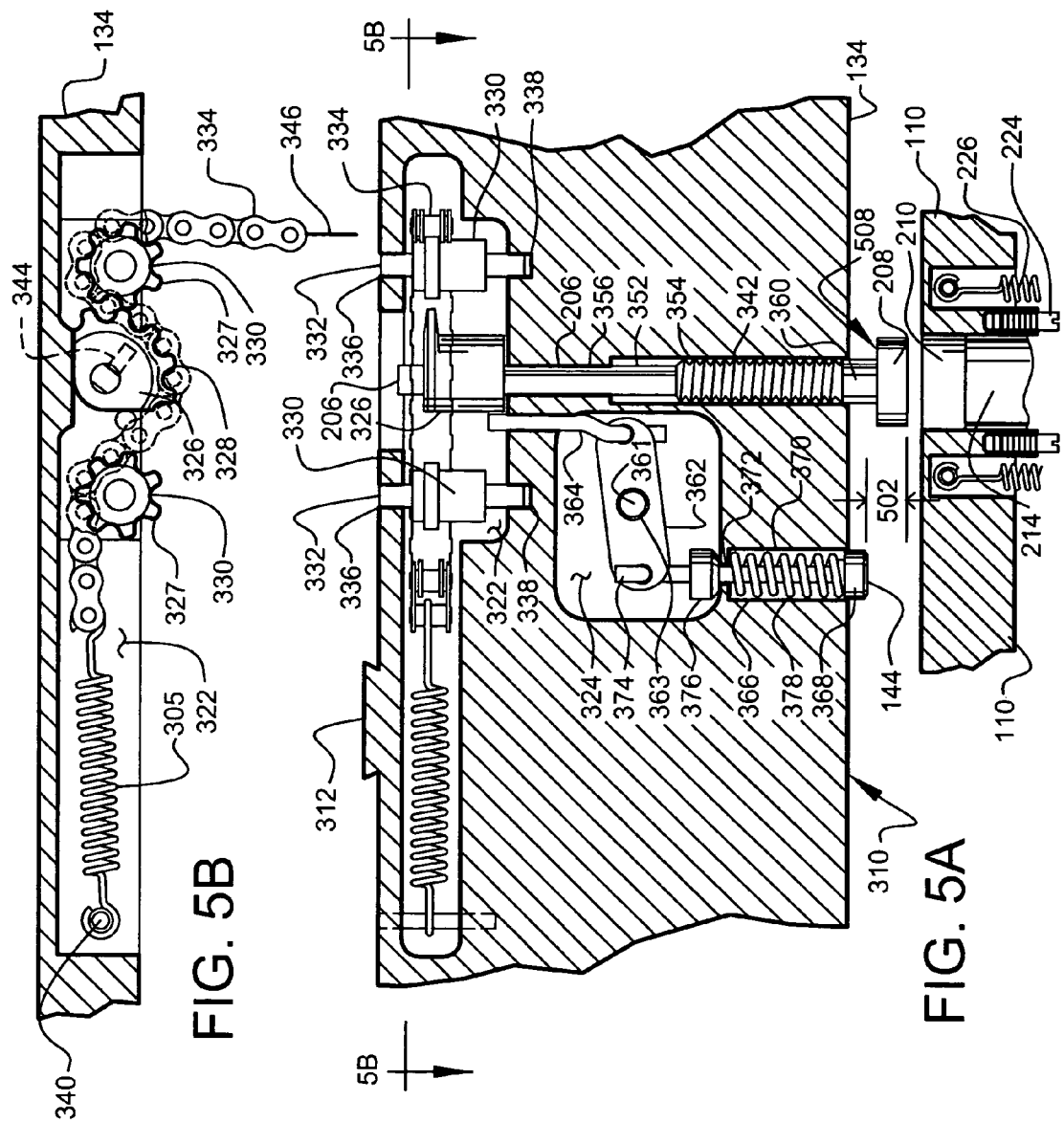
FIG. 5A is a sectional view through the planar section A-A of FIG. 3 illustrating details of an end closure armed for automatic locking to a receiver of the electronics rack cover system.
FIG. 5B is a sectional view through section 5B-5B of FIG. 5A illustrating details of an end closure armed for automatic locking to a receiver of the electronics rack cover system.

Preferably, a spring anchor pin 340 is installed transverse to the actuator cavity 322 at an end of the actuator cavity 322 distal to the quarter sprocket 326. A threaded engager bore 342, as shown in FIG. 5A, through the fourth perimeter surface 310 preferably extends into the actuator cavity 322 to house the engager 206 in axial alignment to the quarter sprocket 326, as shown. The quarter sprocket 326 is preferably fixed to the engager 206 with a setscrew 344, as shown in FIG. 5B. Accordingly, the engager 206 rotates with the quarter sprocket 326. Upon reading the teachings of this specification, those with ordinary skill in the art will now understand that, under appropriate circumstances, considering such issues as simplicity, environmental factors, materials, maintenance costs, reliability, convenience, economics, user preference, etc., other approaches for rotationally biasing the engager, such as rotational springs, solenoids, etc., may suffice.

Preferably, the engager bore 342 is threaded to allow adjustment of the extension of the engager 206 from the fourth perimeter surface 310 for adaptation to various receiver 110 installations, as shown. For example, an engager 206 intended for the upper receiver 110 of FIG. 1B should extend further from the fourth perimeter surface 310 to compensate for the thickness of the instrument panel 124 than an engager 206 intended for an alternate receiver 110 installation with no instrument panel 124 or a thinner instrument panel 124. Upon reading the teachings of this specification, those with ordinary skill in the art will now understand that, under appropriate circumstances, considering such issues as simplicity, environmental factors, materials, maintenance costs, reliability, convenience, economics, user preference, etc., other approaches to adjusting the extension of the engager, such as an adjustable carrier for the engager, a telescoping engager, etc., may suffice.

A smooth resisting pin bore 350, as shown in FIG. 5A, between the rotor cavity 324 and the actuator cavity 322 preferably admits a distal end of a resisting pin 364 that has a proximal end flexibly attached to a rotor 362 in the rotor cavity 324, as shown. The rotor 362 is preferably rotatable to intrude the resisting pin 364 into the actuator cavity 322 through the smooth resisting pin bore opening 514 to prevent rotation of the quarter sprocket 326, as shown. Preferably, the rotor 362 is also rotatable to withdraw the distal end of the resisting pin 364 from the actuator cavity 322, thereby allowing the quarter sprocket 326 to rotate under the influence of the actuator cavity spring 305, as shown (at least herein embodying engager bias means for biasing said engager means toward engagement with said receptor means). Upon reading the teachings of this specification, those with ordinary skill in the art will now understand that, under appropriate circumstances, considering such issues as simplicity, environmental factors, materials, maintenance costs, reliability, convenience, economics, user preference, etc., other approaches to blocking rotation of the quarter sprocket, such as various brakes operable on the engager shaft, a brake on the roller chain, etc., may suffice.

Rotation of the quarter sprocket 326 rotates the engager 206 to which the quarter sprocket 326 is fixed. The rotor 362 rotates in response to the initiator pin 144 that is flexibly attached at a proximal end to the rotor 362. The initiator pin 144 is preferably positioned to abut the front surface of the instrument panel 124 and to be depressed into the smooth initiator pin bore 366 when the cover 116 is aligned to the rack 100 and moved into contact with the instrument panel 124, as shown. Preferably, the initiator pin 144 (at least herein embodying initiator means for initiating engagement of said engager means with said receptor means responsive to said engager bias means after insertion of said engagement means within said receptor means), as it is depressed, rotates the rotor 362 to retract the resisting pin 364 and permit the quarter sprocket 326 to rotate under the influence of the actuator cavity spring 305. Preferably, after the initiator pin 144 is sufficiently depressed to completely retract the resisting pin 364 from the actuator cavity 322, the engager 206 is rotated in the receptor cavity 202 to lock the cover 116 to the receiver 110. Upon reading the teachings of this specification, those with ordinary skill in the art will now understand that, under appropriate circumstances, considering such issues as simplicity, environmental factors, materials, maintenance costs, reliability, convenience, economics, user preference, etc., other approaches to initiating the automatic lock, such as electronic, magnetic, fluidic, or various other initiators, may suffice.

Preferably, the extension of the engager 206 and the extension of the initiator pin 144 from the fourth perimeter surface 310 are each determined in complimentary relationship to the design of the receiver 110 and the particular installation. Preferably, the engager head 208 is inserted completely through the front-facing opening 118 (see again FIG. 2A) to a position inside the receptor cavity 202 before the engager 206 rotates.

FIG. 4A is an exploded perspective view illustrating a cover 116 of the electronics rack cover system 128 according to the preferred embodiment of FIG. 1B. The end closures 134 and 136 (at least herein embodying end closure means for closing said open end means of said panel means) are preferably installed on open ends 107 of the cover panels 130 and 132, as shown. Preferably, the end closure dovetails 312 are inserted in the dovetail grooves 314 of the cover panels 130 and 132, as shown. Setscrews 320 are preferably threaded into the end closures 134 and 136 at oblique angles to engage the cover 116 and prevent sliding of the end closures 134 and 136 relative to the cover panels 130 and 132, as shown. Preferably, the unlocker 138 is centrally located on the front cover panel 130 and the unlock cam 506 has opposed holes for receiving barrel pins 348 for securing cable 346 ends, as shown. Upon reading the teachings of this specification, those with ordinary skill in the art will now understand that, under appropriate circumstances, considering such issues as simplicity, environmental factors, materials, maintenance costs, reliability, convenience, economics, user preference, etc., other approaches to forming a cover, such as casting, stereo lithography, joining side panels to the front panel etc., may suffice.

Figure 4B:
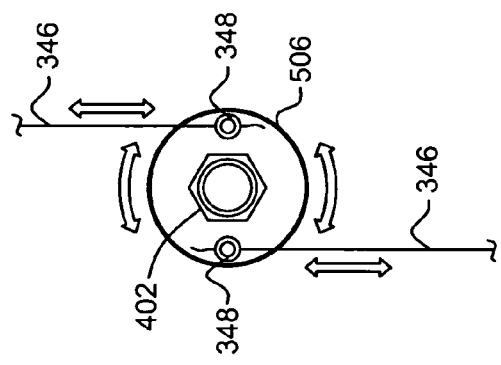
FIG. 4B is a plan view illustrating an unlock cam of the electronics rack cover system according to FIG. 4A.
Figure 4A:
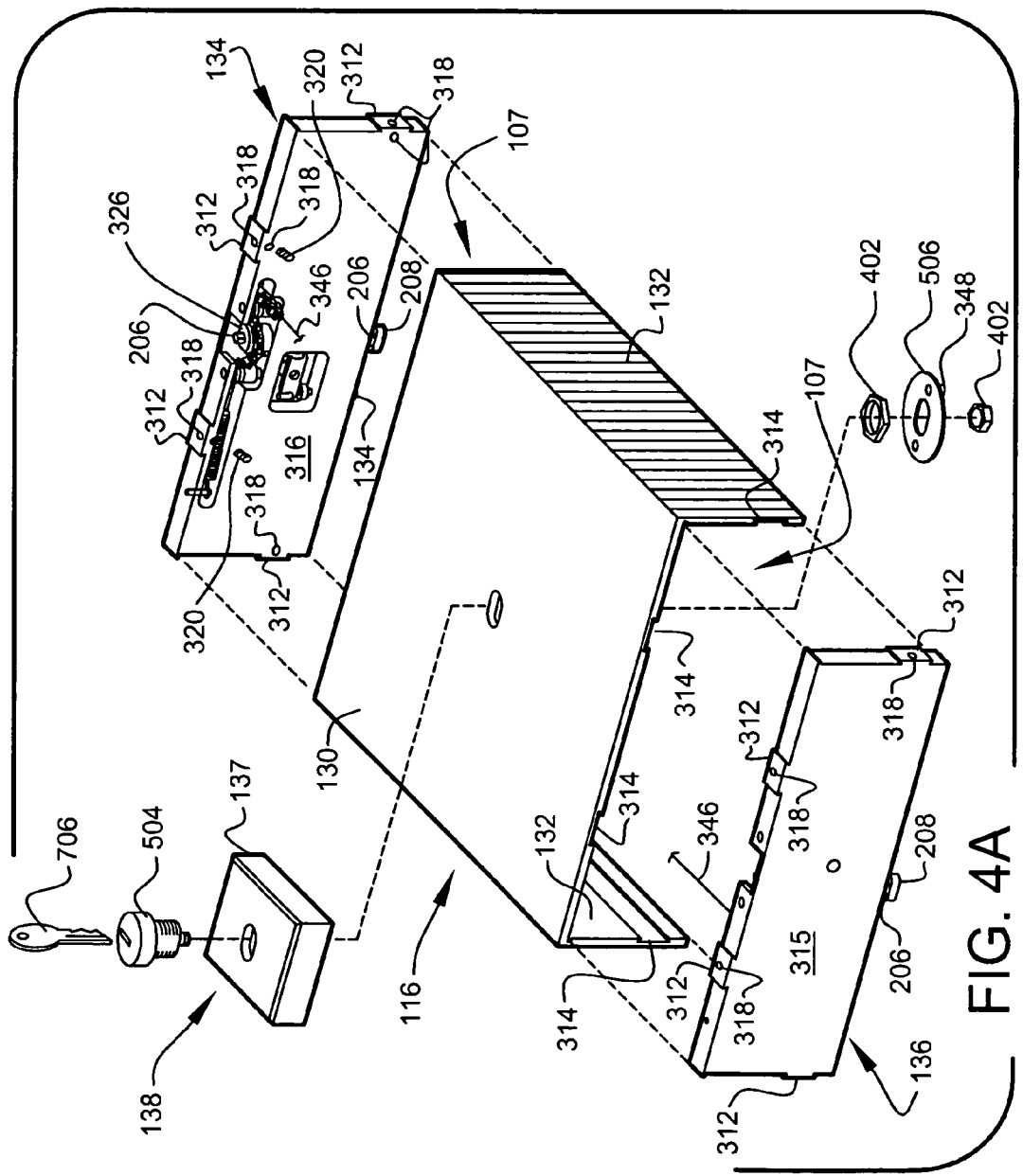
FIG. 4A is an exploded perspective view illustrating a cover of the electronics rack cover system according to the preferred embodiment of FIG. 1B.

FIG. 4B is a plan view illustrating an unlock cam 506 of the electronics rack cover system 128 according to the preferred embodiment of FIG. 4A. The unlocker 138 preferably comprises an unlock mechanism 504 which receives a user-operated mechanical key 706, as shown, and an unlock cam 506 that rotates responsive to mechanical key 706 operation, as shown. Preferably, the unlock cam 506 is approximately centered in the front panel of the cover 116. The unlock cam 506 is received on an end of the unlock mechanism 504 at a point inside cover 116 and is secured using securing nuts 402. The unlock cam 506 rotates in response to the unlock mechanism 504 being operated by a user, preferably with a key 706. Rotation of the unlock cam 506 pulls the cables 346 which pulls the roller chains 334 to rotate the quarter sprockets 326 to unlock the engagers 206 from the receptors 114. The cables 346 are preferably secured to the unlock cam 506 by barrel pins 348. The unlock cam 506 preferably receives the barrel pins 348 in diametrically opposed holes on the unlock cam 506, as shown. In the armed state, the unlock cam 506 is preferably positioned to reduce the tension in the cables 346 attached to the barrel pins 348, as shown. Upon reading the teachings of this specification, those with ordinary skill in the art will now understand that, under appropriate circumstances, considering such issues as simplicity, environmental factors, materials, maintenance costs, reliability, convenience, economics, user preference, etc., other approaches to unlocking the engagers, such as electronic actuators associated with a key pad lock, cams of various shapes and sizes, and unlock mechanisms of various types, etc., may suffice.

FIG. 5A is a sectional view through the planar section A-A of FIG. 3 illustrating details of an end closure 134 armed for automatic locking to a receiver 110 of the electronics rack cover system 128. Preferably, the cylindrical button portion 368 of initiator pin 144 is connected to the rotor 362 by the substantially rigid wire 374, as shown. Preferably, a limiter 376 within the rotor cavity 324 is preferably connected to the substantially rigid wire 374, preferably to limit extension of the button portion from the fourth perimeter surface 310, as shown. An initiator pin spring 378 is preferably housed in the portion of the initiator pin bore 366 preferably having the first diameter 370 in order to bias the initiator pin 144 to the extended position, as shown. The initiator pin 144 preferably has a length sufficient to permit its distal end to protrude beyond the fourth perimeter surface 310 when the rotor 362 is positioned appropriately, as shown. The initiator pin spring 378 is preferably selected to exert sufficient force to move the initiator pin 144, the rotor 362, and the resisting pin 364 against their various frictional loads.

Preferably, the initiator pin 144 is extended from the smooth initiator pin bore 366 by action of the initiator pin spring 378 (at least herein embodying initiator bias means for biasing said initiator means away from initiating engagement with said receptor means), as shown. The initiator pin 144 preferably extends a sufficient length so that, when depressed to a flush position with the fourth perimeter surface 310, it will move the rotor 362 (at least herein embodying remover means for removing said resistor means from resisting said engager bias means responsive to said initiator means; at least herein embodying rotor means for rotating responsive to said initiator means to remove said resistor means) enough to retract the resisting pin 364 (at least herein embodying resistor means for resisting said engager bias means) from the actuator cavity 322, as shown. The engager 206 is preferably adjusted to have a distance 502 between the underside of the engager head 208 and the fourth perimeter surface 310 that is adequate for complete insertion of the engager head 208 into the receptor 114 of the receiver 110, as shown.

Adjustment of the engager 206 is preferably performed by rotating the threaded engager shaft 352 in the threaded engager bore 342. The engager 206 preferably includes a shaft 352, and the engager head 208, as shown. The shaft 352 preferably has a middle threaded portion 354, an upper portion 356 for receiving the quarter sprocket 326 and the setscrew 344, and a lower unthreaded cylindrical portion 360 supporting the engager head 208 of the engager 206, as shown. Upon reading the teachings of this specification, those with ordinary skill in the art will now understand that, under appropriate circumstances, considering such issues as simplicity, environmental factors, materials, maintenance costs, reliability, convenience, economics, user preference, etc., other engager designs, such as various engager head designs, replaceable engager heads, finer threads, etc., may suffice.

The initiator pin 144 is preferably housed in a smooth initiator pin bore 366 preferably extending through the fourth perimeter surface 310 into the rotor cavity 324, as shown. The initiator pin 144 preferably includes a cylindrical button portion 368 slidingly extendable from the initiator pin bore 366, as shown. Preferably, the initiator pin bore 366 includes a first portion preferably having a first diameter 370 adapted to receive the cylindrical button portion 368 and a second portion, preferably having a smaller diameter 372, preferably sized to loosely receive a substantially rigid wire 374, as shown.

FIG. 5B is a sectional view through section 5B-5B of FIG. 5A illustrating details of an end closure armed for automatic locking to a receiver of the electronics rack cover system 128. Roller chain 334 is preferably threaded through sprockets in end closure 134 (similar to end closure 136) of the electronics rack cover system 128. Preferably, an actuator cavity spring 305, anchored to the spring anchor pin 340, preferably extends through a portion of the actuator cavity 322 to connect with the roller chain 334 in the actuator cavity 322, as shown. Preferably, the roller chain 334 is threaded behind the proximal idler sprocket 330, in front of the quarter sprocket 326, and behind the distal idler sprocket 330, as shown. The idler sprockets 330 are preferably positioned to maintain engagement between the roller chain 334 and the quarter sprocket 326, as shown. The roller chain 334 preferably terminates in a connection to a cable 346, as shown, which preferably connects under the front cover panel 130 to the unlock cam 506 via barrel pins 348 (see FIG. 4B). Preferably, the length of the roller chain 334 is selected to ensure engagement with the quarter sprocket 326 in all positional states of the automatic lock 302 and unlocker 138, as shown. The quarter sprocket teeth 328 and the roller chain 334 are preferably selected to operate in a conventional, complimentary manner, as shown. Upon reading the teachings of this specification, those with ordinary skill in the art will now understand that, under appropriate circumstances, considering such issues as simplicity, environmental factors, materials, maintenance costs, reliability, convenience, economics, user preference, etc., other means for transferring linear motion to rotational motion, such as friction belts on drums, various other chains and sprockets, etc., may suffice.

FIG. 6A is a sectional view through the planar section A-A of FIG. 3 illustrating details of an end closure 134 (similar to end cover 136) locked to a receiver 110 of the electronics rack cover system 128. The end closure 134 is preferably abutting the receiver 110, as shown. In a preferred installation, the instrument panel 124 is interposed between the receiver 110 and end closure 134. Accordingly, the engager head 208 is preferably extended to be completely within the receptor cavity 202 of the receiver 110, as shown. Preferably, the initiator pin 144 is depressed into the smooth initiator pin bore 366 to a position flush with the fourth perimeter surface 310, as shown, preferably by the user pressing the cover 116 with the end closure 134 against the receiver 110 (see also FIG. 1C). Accordingly, the rotor 362 is rotated enough to retract the resisting pin 364 from the actuator cavity 322, as shown. Preferably, the quarter sprocket 326 is rotated approximately 90 angular degrees as a result of the action of the actuator cavity spring 305, as shown. Accordingly, the engager head 208 is rotated, as shown, inside the receptor 114 of the receiver 110, thereby locking the cover 116 (see also FIG. 1C) to the receiver 110. Preferably, the surface 508 of the engager head 208 proximate the fourth perimeter surface 310 is in abutment with the inner surface 510 of the front-facing wall of the receptor cavity 202, as shown.

When the quarter sprocket 326 rotates, the quarter sprocket body 512 preferably covers the opening 514 of the resisting pin bore 350 in the actuator cavity, as shown, thereby blocking motion of the rotor 362 and preferably holding the initiator pin 144 in place. Tension on the cables 346 is increased by the pulling action of the actuator cavity spring 305. Preferably, the unlock cam 506 has not rotated from the armed position.

FIG. 6B is a sectional view through section 6B-6B of FIG. 6A illustrating details of the end closure 134 (similar to end cover 136) locked to the receiver 110 of the electronics rack cover system 128. The actuator cavity spring 305 is contracted, preferably, having pulled the roller chain 334 to rotate the quarter sprocket 326, preferably about 90 degrees, as shown. Preferably, the idler sprockets 330 have rotated with the motion of the roller chain 334.

FIG. 7A is a sectional view through the planar section A-A of FIG. 3 illustrating details of the end closure 134 unlocked just prior to removal from the receiver 110 of the electronics rack cover system 128. FIG. 7B is a sectional view through section 7B-7B of FIG. 7A illustrating details of an end closure 134 unlocked just prior to removal from a receiver 110 of the electronics rack cover system 128. Referring to both FIG. 7A and FIG. 7B, with continued reference to the prior figures, preferably, the unlocker 138 is rotated by user operation and the unlock cam 506 is thereby rotated to increase tension in the cables 346 (see also FIG. 4A and FIG. 4B). Preferably, the roller chain 334 is pulled by the tension in the cable 346 to rotate the quarter sprocket 326 to place the engager head 208 in an orientation for being extracted from the receptor 114, as shown. Preferably, the quarter sprocket 326 is not oriented to block resisting pin 364 from extending into the actuator cavity, but neither can the resisting pin 364 move until the fourth perimeter surface 310 is moved away from the receiver 110 by the user.

As the user moves the fourth perimeter surface 310 away from the receiver 110, the initiator pin 144 extends outward from the fourth perimeter surface 310 under the influence of the initiator pin spring 378. Preferably, the rotor 362 rotates in response and thereby intrudes the resisting pin 364 into the actuator cavity 322 to prevent further motion of the quarter sprocket 326 and maintains the tension in the stretched actuator cavity spring 305, as shown. Accordingly, the electronics rack cover system 128 state of FIG. 5A is then re-achieved.

The quarter sprocket 326 has returned to the armed position of FIG. 5B, but the resisting pin 364 is not resisting the force of the actuator cavity spring 305 on the quarter sprocket 326 via the roller chain 334. Rather, tension in cable 346, created and maintained by user operation of the unlocker 138, holds the quarter sprocket 326 and engager 206 in place.

Figure 8:
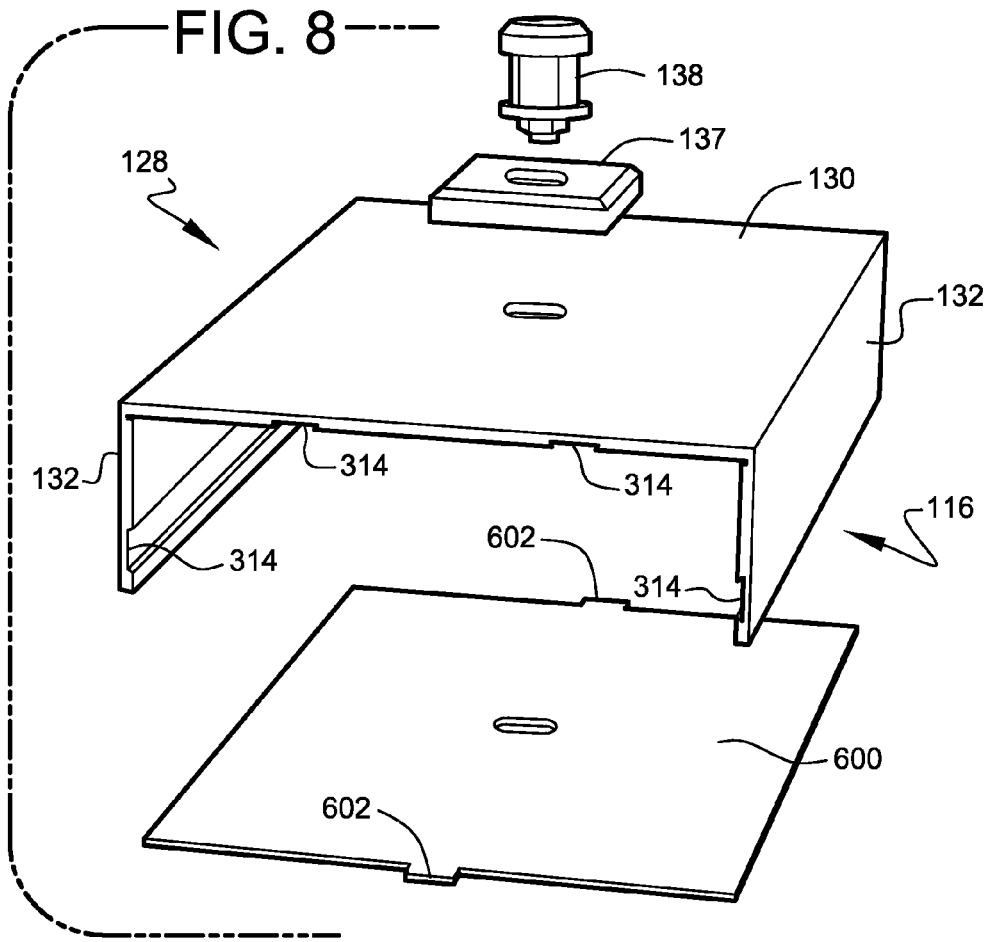
FIG. 8 is an exploded perspective view illustrating a panel and unlocker with a drill-resistant plate of the electronics rack cover system according to an alternate preferred embodiment of the present invention.

FIG. 8 is an exploded perspective view illustrating cover panels 130 and 132 and an unlocker 138 with a drill-resistant plate 600 (at least herein embodying drill-resistant plate means abutted inside said cover means) of the electronics rack cover system 128 according to an alternate preferred embodiment of the present invention. For additional protection, a plate 600 of drill-resistant material, preferably stainless steel, is installed beneath the front panel 130 of the cover 116, as shown. The installation is preferably facilitated by use of tabs 602 that are preferably received in complimentary grooves in the first perimeter surface 304 of the end closures (see FIG. 3). Upon reading the teachings of this specification, those with ordinary skill in the art will now understand that, under appropriate circumstances, considering such issues as simplicity, environmental factors, materials, maintenance costs, reliability, convenience, economics, user preference, etc., other approaches to hardening the cover, such as side and end hardening plates, selecting a harder material for the cover initially, using other drill-resistant materials, etc., may suffice.

Figure 9:
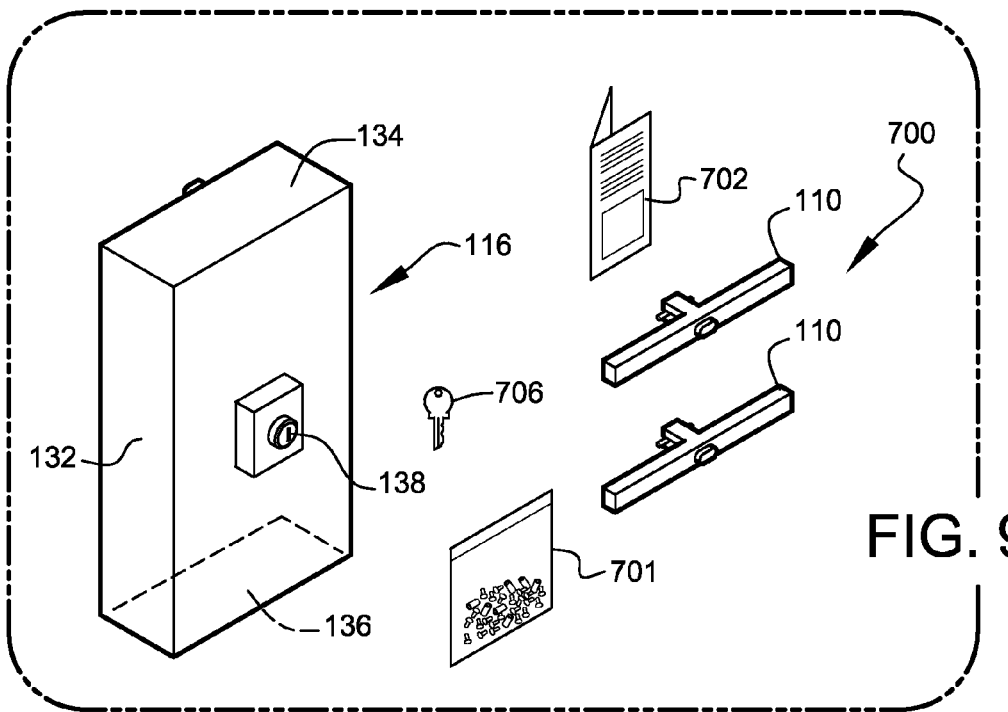
FIG. 9 is a diagram illustrating the kit contents of the electronics rack cover system according to a preferred embodiment of the present invention.

FIG. 9 is a diagrammatic view illustrating a kit 700 of the electronics rack cover system 128 according to a preferred embodiment of the present invention. The kit 700 preferably includes the cover 116, two receivers 110, at least one key 706 for the unlocker 138, mounting hardware 701 for the receivers 110, and instructions 702 for use, as shown. The cover 116 preferably includes two end closures 134 and 136 and the extruded cover panels 130 and 132 assembled at the factory. The mounting hardware 701 is preferably selected for a specific installation. In an alternate embodiment, the mounting hardware 701 may include hardware for various racks 100. Upon reading the teachings of this specification, those with ordinary skill in the art will now understand that, under appropriate circumstances, considering such issues as simplicity, market dynamics, materials, maintenance costs, reliability, convenience, economics, user preference, etc., other kit combinations, such as including the end closures and/or the automatic lock hardware separately for user assembly, adding spare keys, various installation hardware, etc., may suffice.

Figure 10:
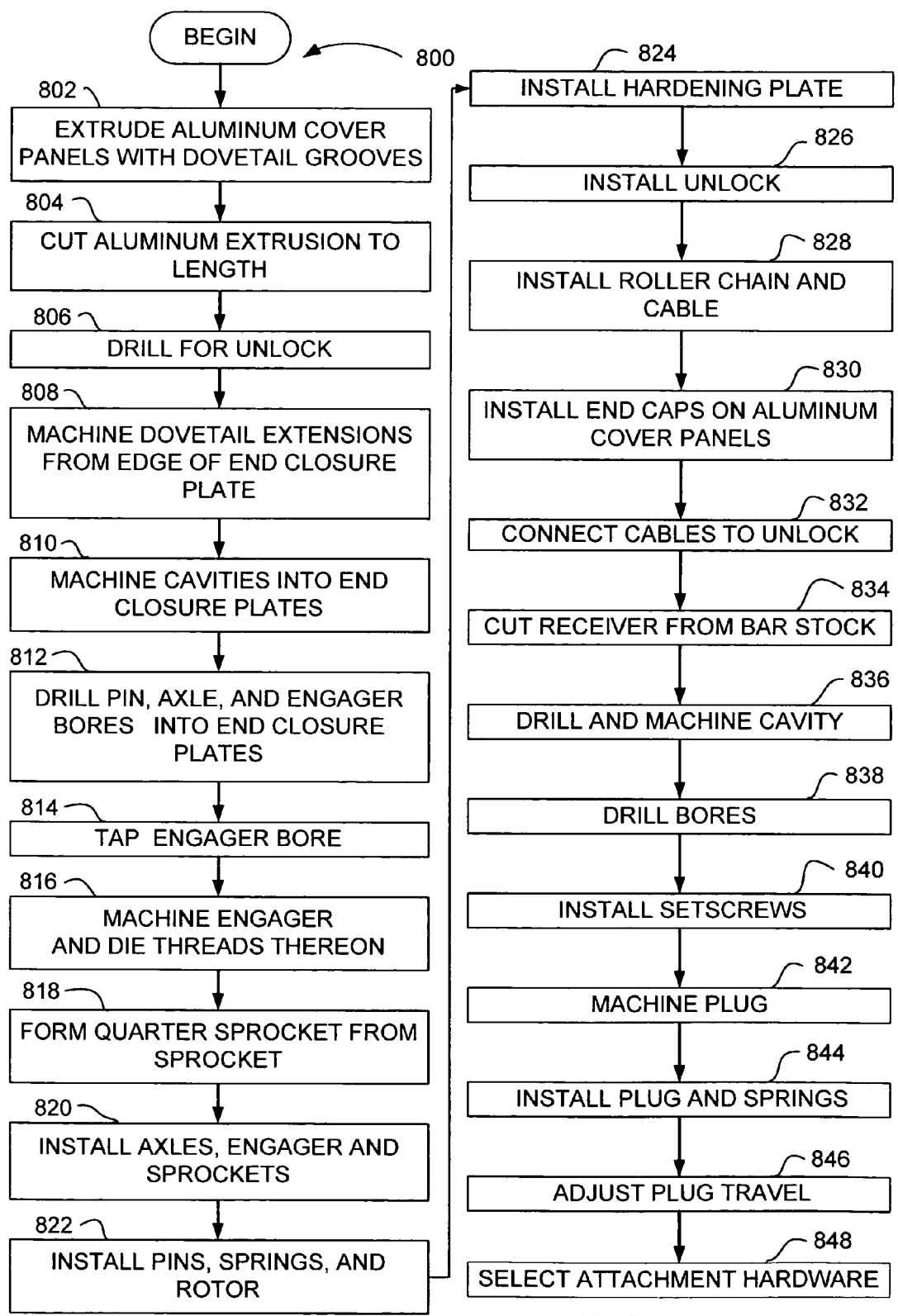
FIG. 10 is a flowchart illustrating a method of manufacturing an electronics rack cover system according to a preferred embodiment of the present invention.

FIG. 10 is a flowchart illustrating a method of manufacturing an electronics rack cover system 128 according to a preferred embodiment of the present invention. In the following method steps of the present invention, it is helpful to refer again to the illustrations of the prior figures. Preferably, in step 802, extruded cover panels 130 and 132 are formed with dovetail grooves 314. The extruded cover panels 130 and 132 comprise the top and side panels (at least herein embodying extruded shape means for providing an extruded shape), preferably of rigid material, more preferably metal, yet more preferably aluminum, and most preferably 6061-T6 aluminum. The dimensions of the extrusion are selected for use with one or more particular avionics racks 100. The front panel 130 is preferably about one-eighth-inch thick, 6.7 inches wide, and about 18 inches long. The side panels 132 are preferably about one-eighth-inch thick and about 2 and one-eighth-inch inches high. The dovetail grooves 314 are preferably on interior surfaces of the front and side panels 130 and 132 and are preferably about 0.06 inches deep and about 0.51 inch to about 0.44 inches wide. The extrusion is preferably formed economically in long continuous pieces, as determined in relation to the machinery and facilities used. Preferably, in step 804, the long extrusion is cut transverse to its length into panel extrusion portions having a size appropriate for particular avionics racks 100 and open ends 107 (at least herein embodying open end means for providing open ends of said panel means). Preferably, the cut panel extrusion portion is then drilled 806 for the unlock mechanism 504.

The end closures 134 and 136 preferably begin as rectangular panels of rigid material, more preferably metal, yet more preferably aluminum, and most preferably 6061-T6 aluminum. Three of the perimeter surfaces 304, 306, and 308 are preferably machined 808 to have dovetails 312 alignable to dovetail grooves 314 in the extruded cover panels 130 and 132. The actuator cavity 322 and the rotor cavity 324 are preferably machined 810 into the rectangular panel. The actuator cavity 322 is preferably machined 810 to have an opening in the first perimeter surface 304 to assist in drilling 812 the resisting pin bore 350 and in installing 820 the quarter sprocket 326. Preferably, bores 232, 350 and 366, for the axle pins 332, anchor pin 340, initiator pin 144, and resisting pin 364 are drilled 812 and the engager bore 342 is drilled 812 and tapped 814, preferably with #10-40 right hand threads. A rotor axle bore 363 is drilled and tapped in the rotor cavity 324. Optionally, a notch is cut in the first perimeter surface 304 of each end closure 134 and 136 to receive a tab 602 of the optional hardening plate 600.

The engager 206 is machined 816 from bar stock, preferably of rigid material, more preferably of metal, yet more preferably of steel, even yet more preferably of stainless steel, and most preferably of 304 stainless steel. The middle portion of the engager 206 is died, preferably to #10-40 right-hand threads. The quarter sprocket 326 is cut 818 from a full sprocket, preferably of rigid material, more preferably of metal, yet more preferably of steel, even yet more preferably of stainless steel, and most preferably of part number A6X 7-1412 produced by Standard Drive Parts-Sterling Instruments of Hyde Park, N.Y.

Preferably, the axle pins 332, the engager 206, and the sprockets 326 and 330 are installed 820 next. The engager 206 is preferably installed 820 by threading the engager 206 into the threaded engager bore 342 and adjusting the engager 206 to a desired extension. The quarter sprocket 326 is preferably installed 820 on the engager shaft 352 in the actuator cavity 322 with a setscrew 344. Preferably, each idler sprocket 330 is installed 820 by being set in place in the actuator cavity 322 with the axle pins 332 installed 820 through the idler sprockets 330 and the axle pin bores 232 and into receiving sides of axle pin bores 232 on the opposite side of the actuator cavity 322.

Preferably, the remaining springs, pins and the rotor 362 are installed 822 next. The rotor axle 361 is preferably installed 822 in the rotor axle bore 363 and the rotor 362 is then installed 822 on the rotor axle 361. Preferably, the initiator pin 144 and the initiator pin spring 378 are installed 822 in the initiator pin bore 366 and the substantially rigid wire 374 of the initiator pin 144 is connected to the rotor 362. The resisting pin 364 is preferably installed 822 in the resisting pin bore 350 and connected to the rotor 362. Preferably, the actuator spring anchor pin 340 is installed 822 in the actuator cavity 322 through the anchor pin bore 340 in the first perimeter surface 304 and through an attachment loop terminating the actuator cavity spring 305. The rotor axle 361 is preferably installed 822 in the rotor axle bore 363 and the rotor 362 is installed on the rotor axle 361.

The optional hardening plate 600 is preferably installed 824 by being positioned in abutment under the front cover panel 130 when the unlocker 138 is installed 826. The unlocker 138 is installed 826 with a spacer 137 above the front cover 116, wherein the spacer 137 thickness compliments the thickness of the hardening plate 600. Installation 824 of the hardening plate 600 is complete when the end closures 134 and 136 are installed 832. Preferably, the roller chain 334 is installed 830 by being threaded over the quarter sprocket 326 and behind each idler sprocket 330 and attached to the actuator cavity spring 305 at a first end and the cable 346 at the second end. The roller chain 334 is preferably adapted to the quarter sprocket 326 and the idler sprockets 330 and is more preferably part number A6Y7-M070 from Standard Drive Parts-Sterling Instruments of Hyde Park, N.Y. The cable 346 is preferably installed 832 by being attached by barrel pins 348 to the unlock cam 506.

Preferably, the receiver 110 is initially cut 834 from bar stock with a protrusion that will become the receptor 114. The bar stock is preferably rigid material, more preferably metal, even more preferably aluminum, and most preferably 6061-T6 aluminum. The receptor 114 is preferably formed by drilling and machining 836 the receptor cavity 202 into the receiver 110 protrusion from the operationally rearward direction and by drilling and machining 836 the front-facing opening 118. Preferably, opposed slots 220 are machined 836 into the receptor cavity sidewalls 222. Closure plug adjustment cavities 223 are preferably drilled 838 into the cavity sidewalls 222 aligned with each slot 220, threaded, and adjustment setscrews 224 are installed 840. Closure plug spring cavities 228 are preferably drilled 838 on either side of the receiver 110 protrusion. Preferably, spring anchor bores 232 are drilled 838 into the receiver support 112 transversely through the closure plug spring cavities 228. The closure plug 210 is preferably formed 842 with a holder 216 on the distal end and inserted into the receptor cavity 202. The spring-biased rod 218 is installed 844 by being inserted in the holder 216. Preferably, each closure plug spring 226 is installed 844 using a closure plug spring anchor pin 340 inserted through the closure plug spring bore 228 and through a proximal end loop on the closure plug spring 226 therein. The distal end of each closure plug spring 226 is preferably attached 844 to the spring-biased rod 218. Closure plug 210 travel is preferably adjusted 846 by threading adjustment setscrews 224 in the closure plug adjustment cavities 223. The attachment mechanisms 120 or mounting hardware 701 are selected 848 for the particular mounting site and receiver 110. Upon reading the teachings of this specification, those with ordinary skill in the art will now understand that, under appropriate circumstances, considering such issues as simplicity, environmental factors, materials, maintenance costs, design, reliability, convenience, economics, user preference, etc., other sequences of the steps, such as forming the receiver 110 first, reordering drilling steps, etc., may suffice.

Upon reading the teachings of this specification, those with ordinary skill in the art will now understand that, under appropriate circumstances, considering such issues as design, environmental factors, materials, maintenance costs, reliability, convenience, economics, user preference, etc., other approaches to using an electronics rack cover system, automatic lock, or end closure, such as combining the present invention with other inventions in related arts, may suffice.

FIG. 11 is a perspective view illustrating an alternate end closure 900 of the electronics rack cover system 128 according to another preferred embodiment of the present invention. Reference is now made to FIG. 11 with continued reference to FIG. 1A FIG. 4A. Preferably, end closure 900 mounts within an open end 107 of cover 116 in a manner similar to end closure 134 and end closure 136. Preferably, the end closure 900 similarly comprises a generally rectangular flat panel machined to support an alternate automatic lock 902 (at least herein embodying wherein said end closure means comprises said automatic lock means) and to connect to cover panels 130 and 132 to assist in forming a cover 116, as shown in FIG. 4A. Preferably, automatic lock 902 differs from automatic lock 302 in that engager 206 comprises an alternate armature assembly 904, as shown. The armature assembly 904 is preferably fixed to the engager 206 with a setscrew 906, as shown. Accordingly, the engager 206 rotates with the armature assembly 904.

FIG. 12 is a top view, partially in section, further illustrating the actuating mechanism of the automatic lock 902 of FIG. 11. Preferably, armature assembly 904 comprises aperture 908 preferably adapted to receive a first end 910a of actuator rod 910, as shown. Preferably, aperture 908 is sized to permit free rotation of actuator rod 910 within armature assembly 904. Preferably, first end 910a comprises a bend, hook, or similar configuration, adapted to removably retain first end 910a within aperture 908. Preferably, actuator rod 910 comprises a substantially rigid wire sized to resist deflection under the compressive forces applied during operation.

Preferably, the second end 910b of actuator rod 910 comprises a fixed end stop 912, as shown. Preferably, end stop 912 is removably attached to the second end 910b, as shown. Preferably, second end 910b is engaged within an aperture 914a passing through pivot 914, as shown. Preferably, pivot 914 is adapted to permit actuator rod 910 to move freely, in a back-and-forth motion, within the aperture 914a of pivot 914. Preferably, pivot 914 is pivotally mounted to the rotatable arm 920 of unlocker 922 (see FIG. 13 below). Preferably, actuator rod 910 further comprises spring stop 916, as shown. Preferably, spring stop 916 is rigidly fixed to actuator rod 910.

Preferably, a spring 918 is engaged upon actuator rod 910, between pivot 914 and spring stop 916, as shown. In preferred applications of the present invention, preferred embodiments of automatic lock 902 comprises an additional spring 924 (illustrated by dashed lines), adapted to bias armature assembly 904 toward rotational motion, as shown.

Figure 13:
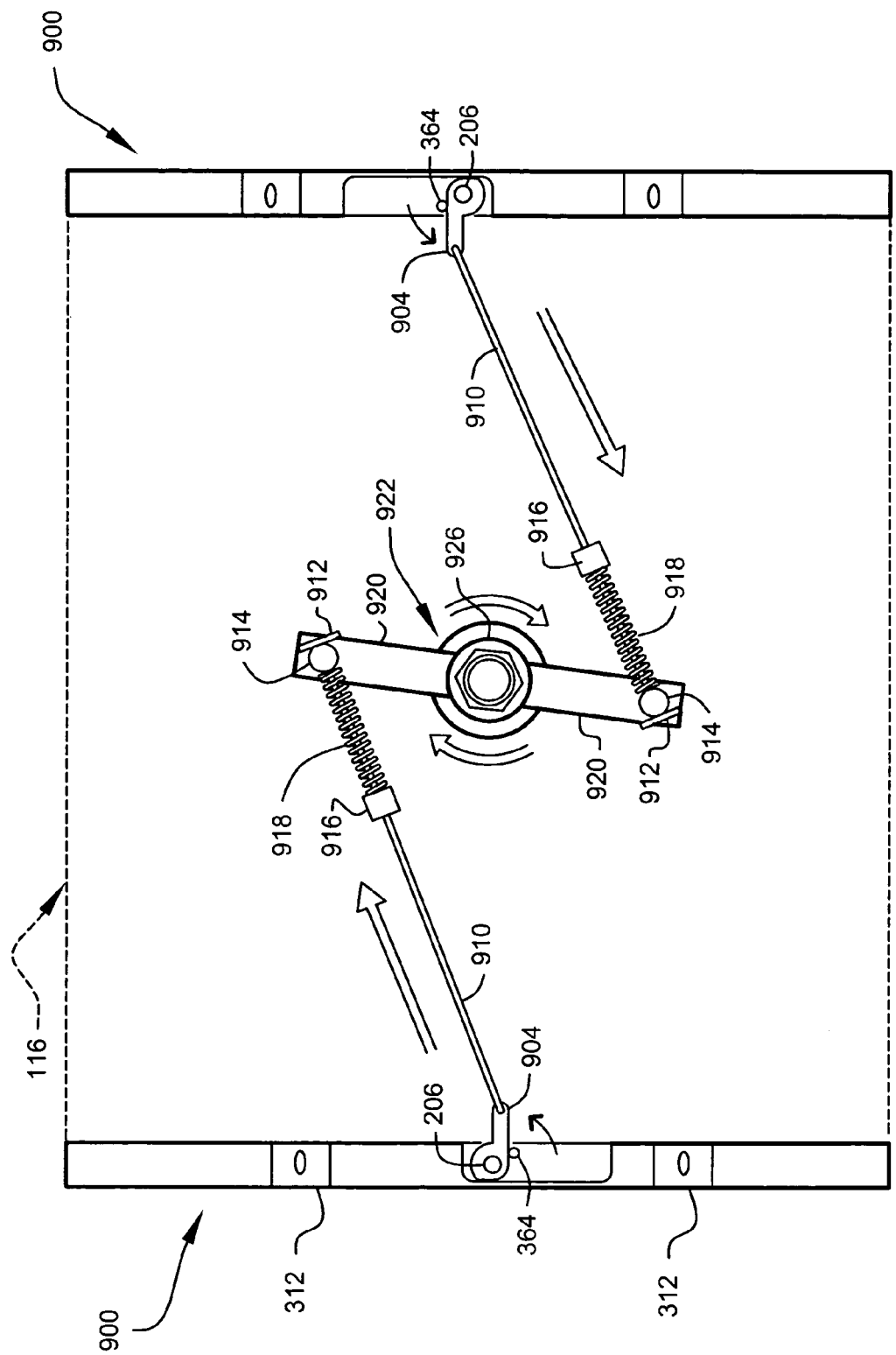
FIG. 13 is a top view illustrating the unlocking of the actuating mechanism of the end closure of FIG. 11.

FIG. 13 is a top view diagrammatically illustrating a method of unlocking the automatic lock 902 of FIG. 11. The unlocker 922 preferably comprises an unlock mechanism 926 which receives a user-operated mechanical key (preferably, in the manner of the prior embodiments). The unlocker 922 (at least herein embodying unlocker means for unlocking said cover means from said receiver means after engagement of said engager with said receptor) is preferably operable by the user to simultaneously unlock both automatic locks 902 with the key. Preferably fixed to the unlock mechanism 926 are two outwardly extending arms 920 adapted to rotate responsive to the mechanical operation of the key.

To unlock the automatic locks 902, unlock mechanism 926 is rotated, by key action, in a clockwise motion, as shown. It should be noted that the terms clockwise and counterclockwise are used to describe relative motions and may be interchangeable depending on such factors as observer orientation, locker selection, etc., without departing from the present invention. As the arms 920 rotate, the actuator rods 910 preferably slide through the pivots 914 until the pivots 914 encounter the end stops 912, as shown. As the arms 920 continue to rotate, the actuator rods 910 are preferably drawn in a direction generally away from the automatic locks 902, as indicated by the set of parallel arrows. This preferred action results in both of the armature assemblies 904 being rotated to place each of the engagers 206 in the unlocked position. On reaching the unlocked position (with the initiator pin if FIG. 11 extended) the resisting pins 364 are engaged to restrain the movement of the armature assemblies 904 (in same manner as described in the prior embodiments).

Figure 14:
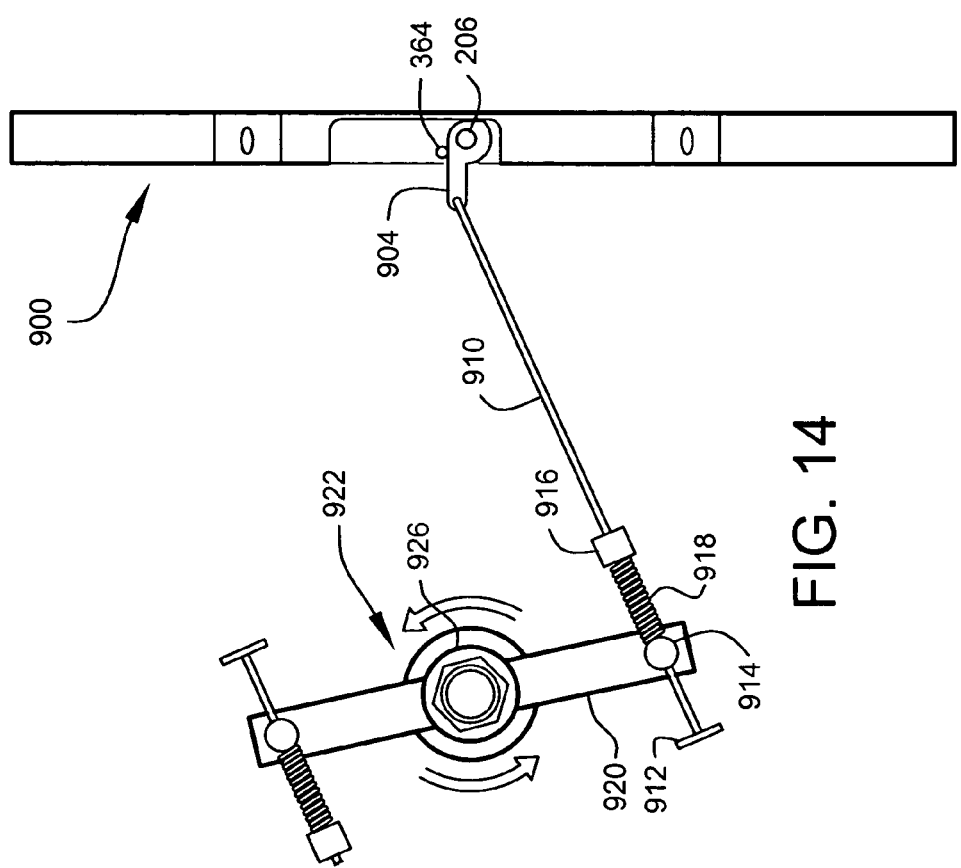
FIG. 14 is a partial top view illustrating the arming of the actuating mechanism of the alternate end closure of FIG. 11.

FIG. 14 is a partial top view illustrating a method of arming the automatic lock 902 of FIG. 11. In the following figures, one-half of the mechanical operation will be illustrated, however, it is understood that the descriptions and teachings also apply to the functionally symmetrical opposing side. Preferably, the unlock mechanism 926 comprises a "return-action" that requires the unlock mechanism 926 to be rotated counterclockwise to remove the key. As the unlock mechanism 926 is rotated counterclockwise, pivot 914 slides along the actuator rod 910 preferably moving toward spring stop 916, as shown. Recalling that the spring stop 916 is preferably fixed to the actuator rod 910, the spring 918 is compressed by the motion of pivot 914 along actuator rod 910, as shown. Preferably, the key is removed as unlock mechanism 926 reaches the approximate position indicated in FIG. 14, thus fixing the position of the arm 920 while holding the spring 918 in the compressed state. Preferably, the force of the spring 918 against the spring stop 916 is transmitted through the actuator rod 910 to armature assembly 904. Thus, automatic lock 902 is armed and made ready for the next automatic locking operation.

Figure 15:
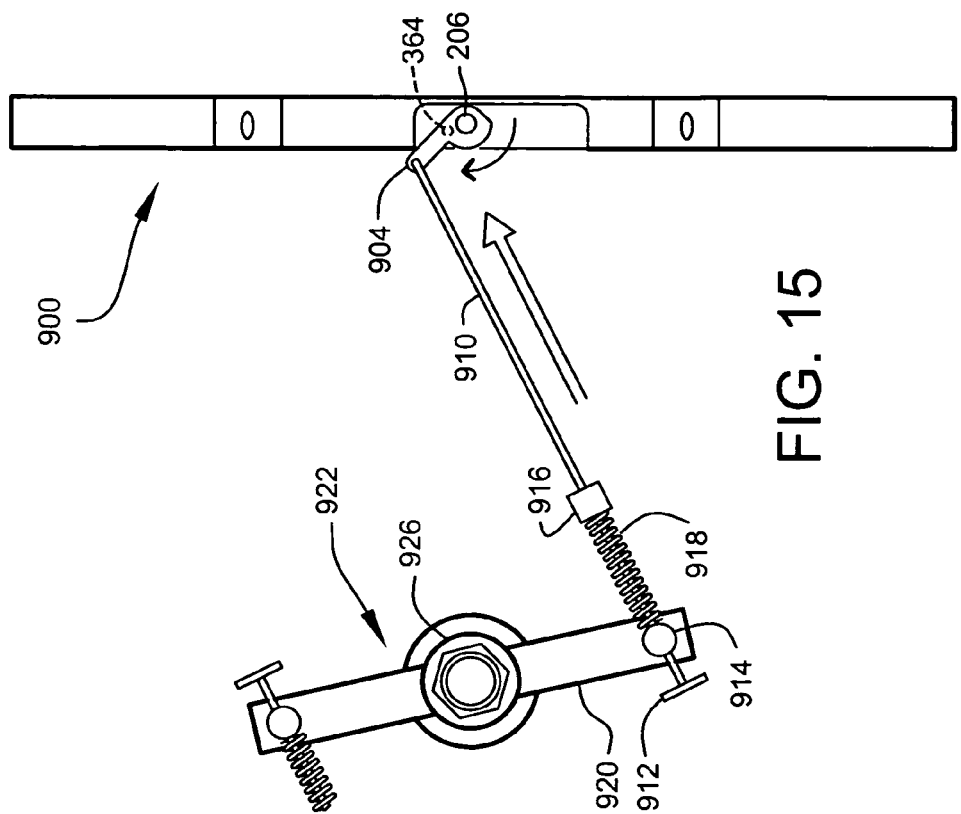
FIG. 15 is a partial top view illustrating the automatic locking of the actuating mechanism of the alternate end closure of FIG. 11.

FIG. 15 is a partial top view illustrating the automatic locking action of the automatic lock 902 of FIG. 11. Preferably, as in the prior embodiments, depressing the initiator pin 144 (see FIG. 11) rotates the rotor 362 to retract the resisting pin 364 thus permitting the armature assembly 904 to rotate under the influence of the spring 918. Preferably, after the resisting pin 364 is sufficiently retracted, the engager 206 rotates (preferably while engaged within the receptor cavity) to lock the cover 116 over the electronics to be protected.

Although applicant has described applicant's preferred embodiments of this invention, it will be understood that the broadest scope of this invention includes such modifications as diverse shapes and sizes and materials. Such scope is limited only by the below claims as read in connection with the above specification. Further, many other advantages of applicant's invention will be apparent to those skilled in the art from the above descriptions and the below claims.

What is claimed is:

1. An avionics rack cover system, relating to obstructing unauthorized access to at least one front face of at least one avionics rack operable to receive at least one avionics instrument installable proximate the at least one avionics rack, comprising:
    a) at least one cover adapted to cover the at least one front face;
    b) at least one receiver structured and arranged to receive said at least one cover;
    c) wherein said at least one receiver comprises
        i) at least one receptor structured and arranged to be receptive to at least one portion of said at least one cover, and
        ii) at least one support structured and arranged to support said at least one receptor substantially behind the at least one front face and proximate the at least one avionics rack; and
    d) at least one automatic lock structured and arranged to automatically lock said at least one cover to said at least one receiver responsive to said at least one receiver receiving said at least one cover.

2. The avionics rack cover system according to claim 1, wherein said automatic lock comprises:
    a) at least one engager structured and arranged to engage said at least one receptor;
    b) at least one engager biasing mechanism adapted to bias said at least one engager toward engagement with said at least one receptor; and
    c) at least one initiator structured and arranged to initiate engagement of said at least one engager with said at least one receptor responsive to said at least one engager biasing mechanism after insertion of said at least one engager within said at least one receptor.

3. The avionics rack cover system according to claim 2, wherein said at least one initiator comprises at least one initiator biasing mechanism adapted to bias said at least one initiator away from initiating engagement with said at least one receptor.

4. The avionics rack cover system according to claim 2, wherein said automatic lock further comprises:
    a) at least one resistor adapted to resist said at least one engager biasing mechanism; and
    b) at least one remover structured and arranged to remove said at least one resistor from resisting said at least one engager biasing mechanism responsive to said at least one initiator.

5. The avionics rack cover system according to claim 4, wherein said at least one remover comprises at least one rotor adapted to rotate responsive to said at least one initiator to remove said at least one resistor.

6. The avionics rack cover system according to claim 1, wherein said at least one cover comprises at least one panel structured and arranged to panel over the at least one front face.

7. The avionics rack cover system according to claim 6, wherein said at least one panel comprises:
    a) at least one extruded shape structured and arranged to provide an extruded shape for said at least one panel; and
    b) at least one open end adapted to provide at least one closable open end of said at least one panel.

8. The avionics rack cover system according to claim 7, wherein said at least one cover further comprises at least one end closure structured and arranged to close said at least one open end of said at least one panel.

9. The avionics rack cover system according to claim 8, wherein said at least one end closure comprises said at least one automatic lock.

10. The avionics rack cover system according to claim 7, wherein said at least one panel comprises at least one unlocker structured and arranged to unlock said at least one automatic lock.

11. The avionics rack cover system according to claim 1, further comprising at least one unlocker structured and arranged to unlock said at least one cover after engagement of said at least one engager with said at least one receptor.

12. The avionics rack cover system according to claim 1, further comprising at least one drill-resistant plate abutted inside said at least one cover.

13. An avionics rack cover system, relating to obstructing unauthorized access to at least one front face of at least one avionics rack operable to receive at least one avionics instrument installable proximate the at least one avionics rack, comprising:
    a) at least one cover structured and arranged to at least partially cover the at least one front face; and
    b) at least one automatic lock structured and arranged to automatically lock said at least one cover to the at least one avionics rack responsive to said at least one cover being placed in aligned abutment with the at least one avionics rack.

14. An avionics rack cover system, relating to obstructing unauthorized access to at least one front face of at least one avionics instrument installed in at least one avionics rack in an aircraft, comprising:
    a) at least one substantially rigid cover having one open face; at least one automatic lock fixed to said at least one substantially rigid cover; and
    b) at least one lock release mechanism attached to said at least one substantially rigid cover, accessible to at least one user, and operable to release said at least one automatic lock;
    c) wherein said at least one automatic lock is adapted to lock proximate to the at least one avionics rack; and
    d) wherein said at least one automatic lock is not directly accessible to such at least one user when locked.

15. A cover system, relating to obstructing unauthorized access to at least one front portion of at least one instrument panel having at least one instrument installable proximate the at least one instrument panel, comprising:
    a) at least one cover structured and arranged to at least partially cover the front portion of the at least one instrument panel; and
    b) at least one receiver structured and arranged to receive such at least one cover;
    c) wherein such at least one receiver comprises at least one positioner structured and arranged to position such at least one receiver in relation to the at least one instrument panel to receive at least one portion of said at least one cover at least one position substantially behind the at least one instrument panel;

d) at least one automatic lock structured and arranged to lock said at least one cover to said at least one receiver responsive to said at least one receiver receiving said at least one cover.

16. The cover system according to claim 15, further comprising:
   a) at least one manual unlocker structured and arranged to manually unlock said at least one automatic lock;
   b) wherein said at least one manual unlocker is mechanically distinct from said at least one automatic lock.

17. The cover system according to claim 15, wherein said at least one cover comprises at least one panel adapted to at least partially panel over the front portion of the at least one instrument panel.

18. The cover system according to claim 17, wherein said at least one panel comprises:
   a) at least one extruded shape adapted to provide shape to said at least one panel; and
   b) at least one open end adapted to provide at least one open end of said at least one extruded shape.

19. The cover system according to claim 18, further comprising at least one end closure structured and arranged to close said at least one open end of said at least one extruded shape.

20. The cover system according to claim 19, wherein said at least one cover further comprises at least one partition structured and arranged to partition at least one channel.

21. The cover system according to claim 19 wherein said at least one end closure comprises said at least one automatic lock.

22. The cover system according to claim 15, further comprising at least one drill-resistant plate, structured and arranged to resist drilling through said at least one cover, abutted inside said at least one cover.

* * * * *

UNITED STATES PATENT AND TRADEMARK OFFICE
CERTIFICATE OF CORRECTION

| | | |
|---|---|---|
| PATENT NO. | : 7,784,738 B1 | Page 1 of 1 |
| APPLICATION NO. | : 11/088128 | |
| DATED | : August 31, 2010 | |
| INVENTOR(S) | : Landes et al. | |

It is certified that error appears in the above-identified patent and that said Letters Patent is hereby corrected as shown below:

Column 24, line 66 to 67 "one cover at least one position substantially behind the at least one instrument panel;" should read --one cover at at least one position substantially behind the at least one instrument panel;--

Signed and Sealed this

Thirty-first Day of May, 2011

David J. Kappos
*Director of the United States Patent and Trademark Office*